(12) United States Patent
Damborsky et al.

(10) Patent No.: US 11,411,148 B2
(45) Date of Patent: *Aug. 9, 2022

(54) LIGHT-EMITTING DIODE PACKAGE WITH LIGHT-ALTERING MATERIAL

(71) Applicant: CreeLED, Inc., Durham, NC (US)

(72) Inventors: Kyle Damborsky, Apex, NC (US); Derek Miller, Raleigh, NC (US); Jack Vu, Raleigh, NC (US); Peter Scott Andrews, Durham, NC (US); Jasper Cabalu, Apex, NC (US); Colin Blakely, Raleigh, NC (US); Jesse Reiherzer, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/016,701

(22) Filed: Sep. 10, 2020

(65) Prior Publication Data

US 2021/0005793 A1 Jan. 7, 2021

Related U.S. Application Data

(62) Division of application No. 16/686,457, filed on Nov. 18, 2019, now Pat. No. 10,811,573, which is a
(Continued)

(51) Int. Cl.
*H01L 33/00* (2010.01)
*H01L 33/52* (2010.01)
(Continued)

(52) U.S. Cl.
CPC .............. *H01L 33/52* (2013.01); *H01L 33/26* (2013.01); *H01L 33/502* (2013.01); *H01L 33/60* (2013.01)

(58) Field of Classification Search
CPC ......... H01L 33/52; H01L 33/54; H01L 33/56; H01L 33/26; H01L 33/502; H01L 33/505;
(Continued)

(56) References Cited

U.S. PATENT DOCUMENTS 8,564,000 B2 10/2013 Hussell et al.
8,669,573 B2 3/2014 Medendorp, Jr.
(Continued)

FOREIGN PATENT DOCUMENTS

WO 2015101899 A1 7/2015
WO 2016022707 A1 2/2016

OTHER PUBLICATIONS

Non-Final Office Action for U.S. Appl. No. 15/957,454, dated May 1, 2019, 10 pages.
(Continued)

*Primary Examiner* — Calvin Y Choi
(74) *Attorney, Agent, or Firm* — Withrow & Terranova, P.L.L.C.

(57) ABSTRACT

Solid-state lighting devices including light-emitting diodes (LEDs) and more particularly packaged LEDs with light-altering materials are disclosed. A light-altering material is provided in particular configurations within an LED package to redirect light from an LED chip within the LED package and contribute to a desired emission pattern of the LED package. The light-altering material may also block light from the LED chip from escaping in a non-desirable direction, such as large or wide angle emissions. The light-altering material may be arranged on a lumiphoric material adjacent to the LED chip in various configurations. The LED package may include an encapsulant on the light-altering material and the lumiphoric material.

26 Claims, 27 Drawing Sheets

Related U.S. Application Data division of application No. 15/957,454, filed on Apr. 19, 2018, now Pat. No. 10,522,722.

(51) Int. Cl.
*H01L 33/26* (2010.01)
*H01L 33/60* (2010.01)
*H01L 33/50* (2010.01)

(58) Field of Classification Search
CPC ....... H01L 33/507; H01L 33/58; H01L 33/60; H01L 33/62; H01L 25/0753; H01L 2224/16225
USPC .......................................................... 257/98
See application file for complete search history.

(56) References Cited

U.S. PATENT DOCUMENTS

| | | | |
|---|---|---|---|
| 8,866,169 B2 | 10/2014 | Emerson et al. | |
| 9,070,850 B2 | 6/2015 | Keller et al. | |
| 9,887,327 B2 | 2/2018 | Reiherzer et al. | |
| 10,516,081 B1* | 12/2019 | Xin | H01L 33/24 |
| 10,522,722 B2 | 12/2019 | Damborsky et al. | |
| 10,811,573 B2 | 10/2020 | Damborsky et al. | |
| 2006/0145172 A1 | 7/2006 | Su et al. | |
| 2008/0191225 A1 | 8/2008 | Medendorp | |
| 2010/0320482 A1* | 12/2010 | Tachibana | H05K 3/284 257/88 |
| 2013/0322088 A1 | 12/2013 | Huang et al. | |
| 2013/0334559 A1 | 12/2013 | Vdovin et al. | |
| 2014/0021493 A1 | 1/2014 | Andrews et al. | |
| 2014/0226317 A1 | 8/2014 | Livesay et al. | |
| 2014/0291715 A1 | 10/2014 | Reiherzer et al. | |
| 2015/0179903 A1 | 6/2015 | Pun et al. | |
| 2015/0280081 A1 | 10/2015 | Wada | |
| 2016/0093780 A1 | 3/2016 | Beppu et al. | |
| 2017/0069606 A1* | 3/2017 | Gould | H01L 33/507 |
| 2017/0098746 A1 | 4/2017 | Bergmann et al. | |
| 2017/0294560 A1 | 10/2017 | Ho et al. | |
| 2019/0326485 A1 | 10/2019 | Damborsky et al. | |
| 2021/0217936 A1 | 7/2021 | Shi et al. | |

OTHER PUBLICATIONS

Final Office Action for U.S. Appl. No. 15/957,454, dated Jul. 26, 2019, 14 pages.

Notice of Allowance for U.S. Appl. No. 15/957,454, dated Aug. 27, 2019, 8 pages.

International Search Report and Written Opinion for International Patent Application No. PCT/US2019/021393, dated May 22, 2019, 18 pages.

Non-Final Office Action for U.S. Appl. No. 16/686,457, dated Feb. 24, 2020, 6 pages.

Notice of Allowance for U.S. Appl. No. 16/686,457, dated Jun. 12, 2020, 7 pages.

International Preliminary Report on Patentability for International Patent Application No. PCT/US2019/021393, dated Oct. 29, 2020, 12 pages.

Examination Report for European Patent Application No. 19712473.8, dated Dec. 17, 2021, 9 pages.

Non-Final Office Action for U.S. Appl. No. 17/019,593, dated May 9, 2022, 15 pages.

* cited by examiner

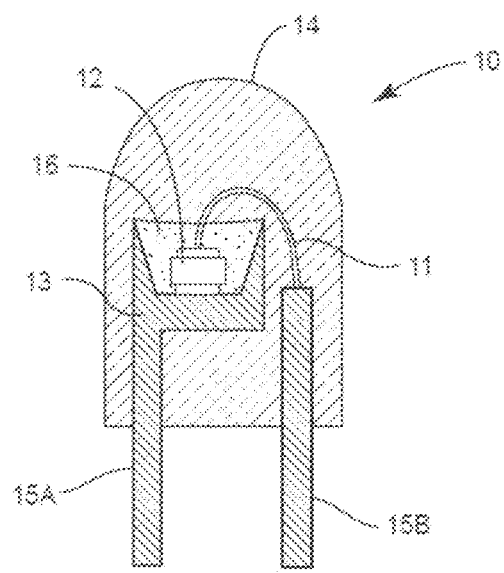
FIG._1
RELATED ART
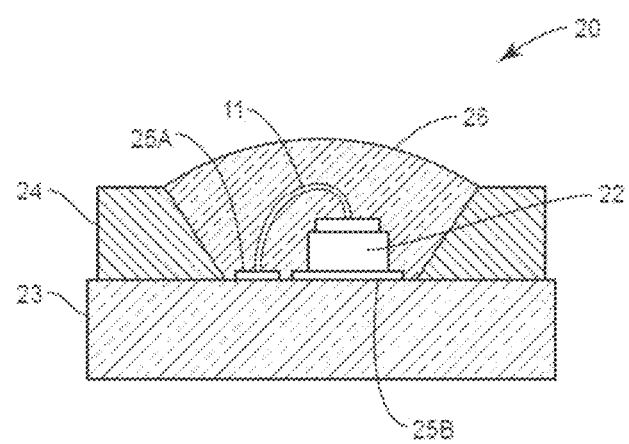
FIG._2
RELATED ART
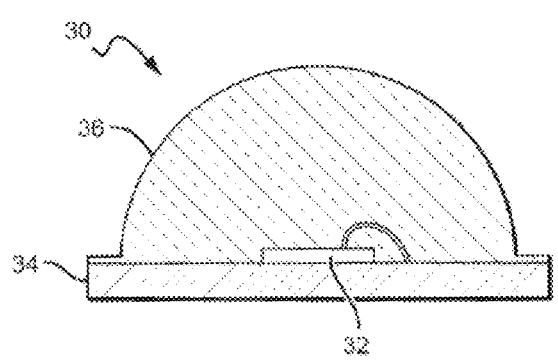
FIG._3
RELATED ART

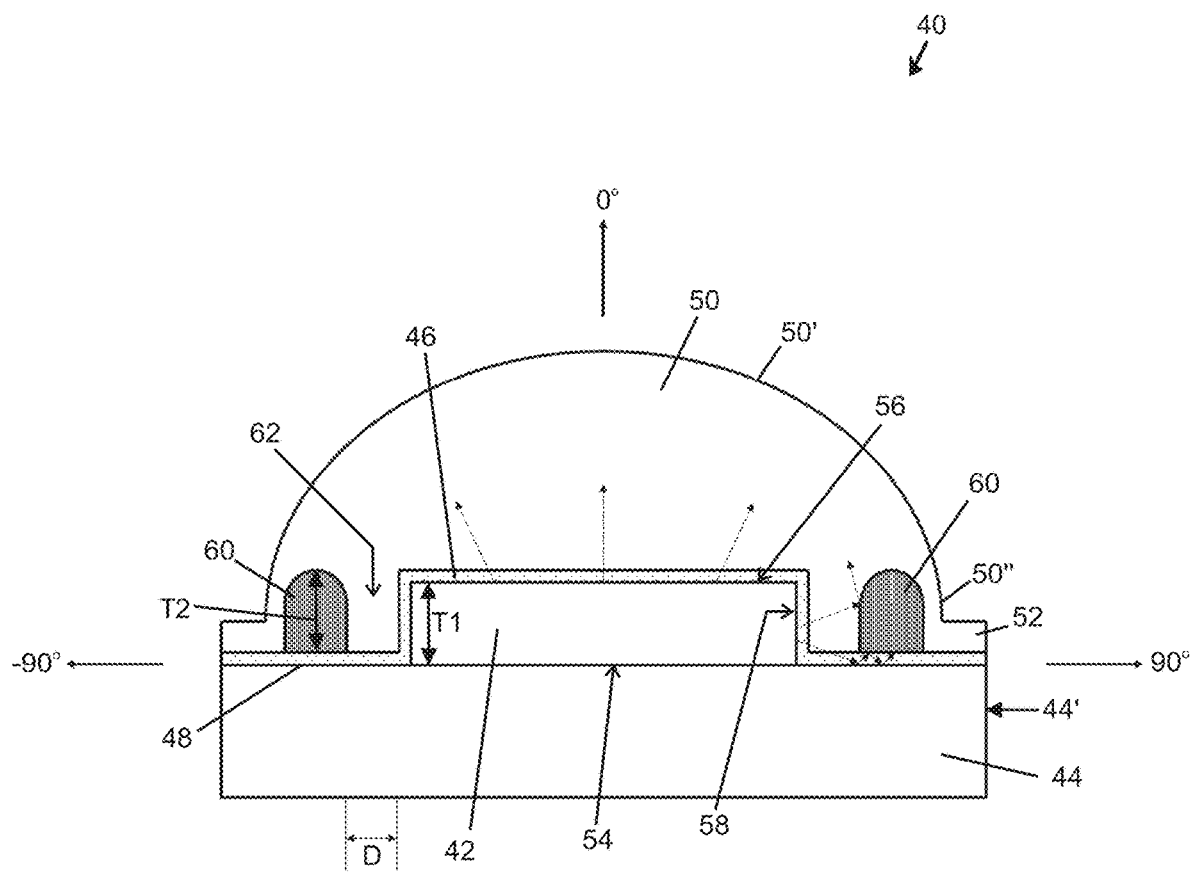
FIG._4A

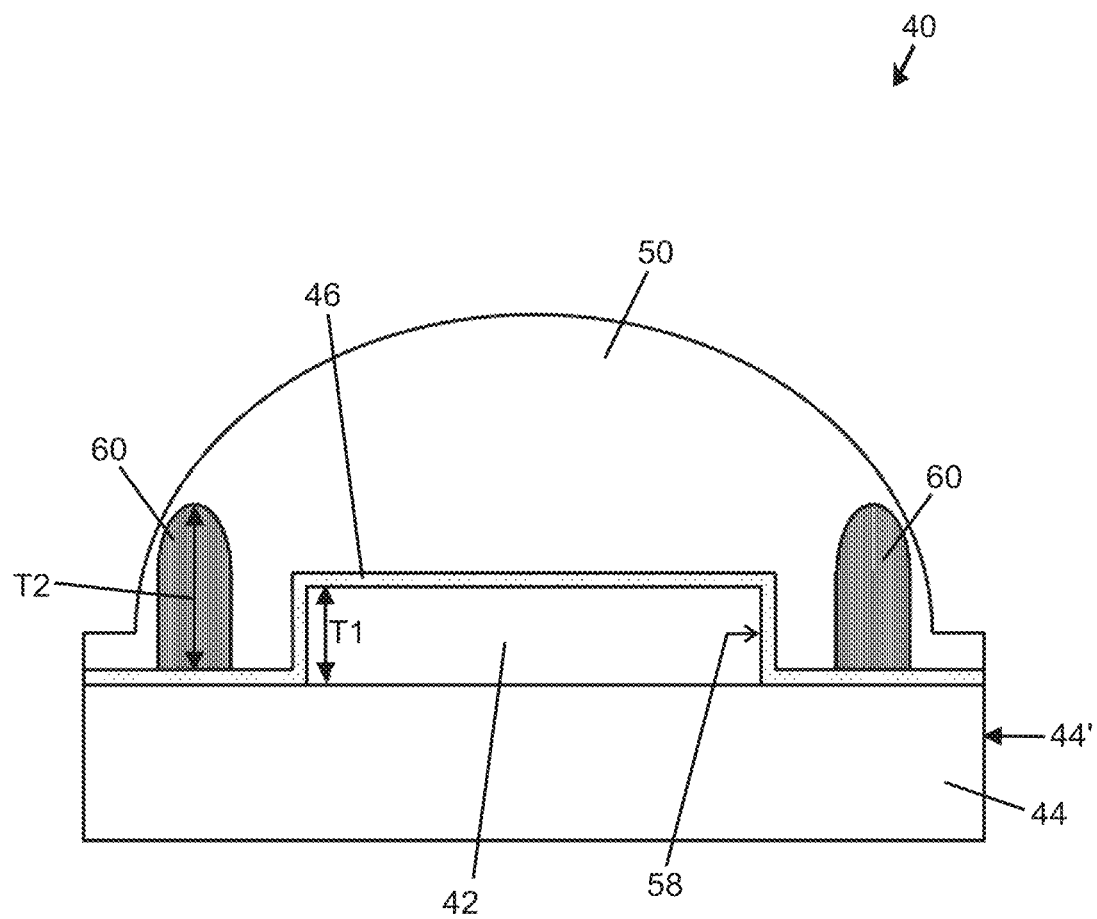
FIG._4B

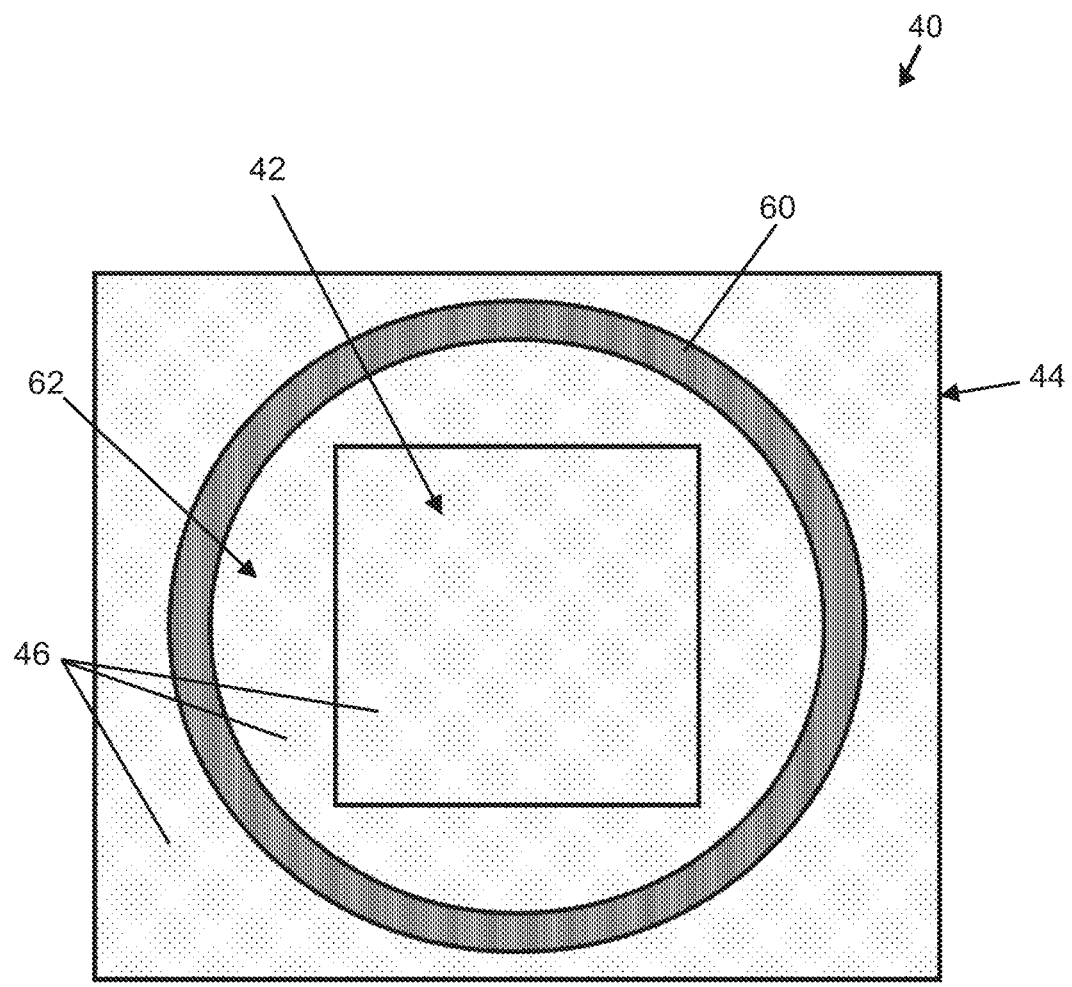
FIG._4C

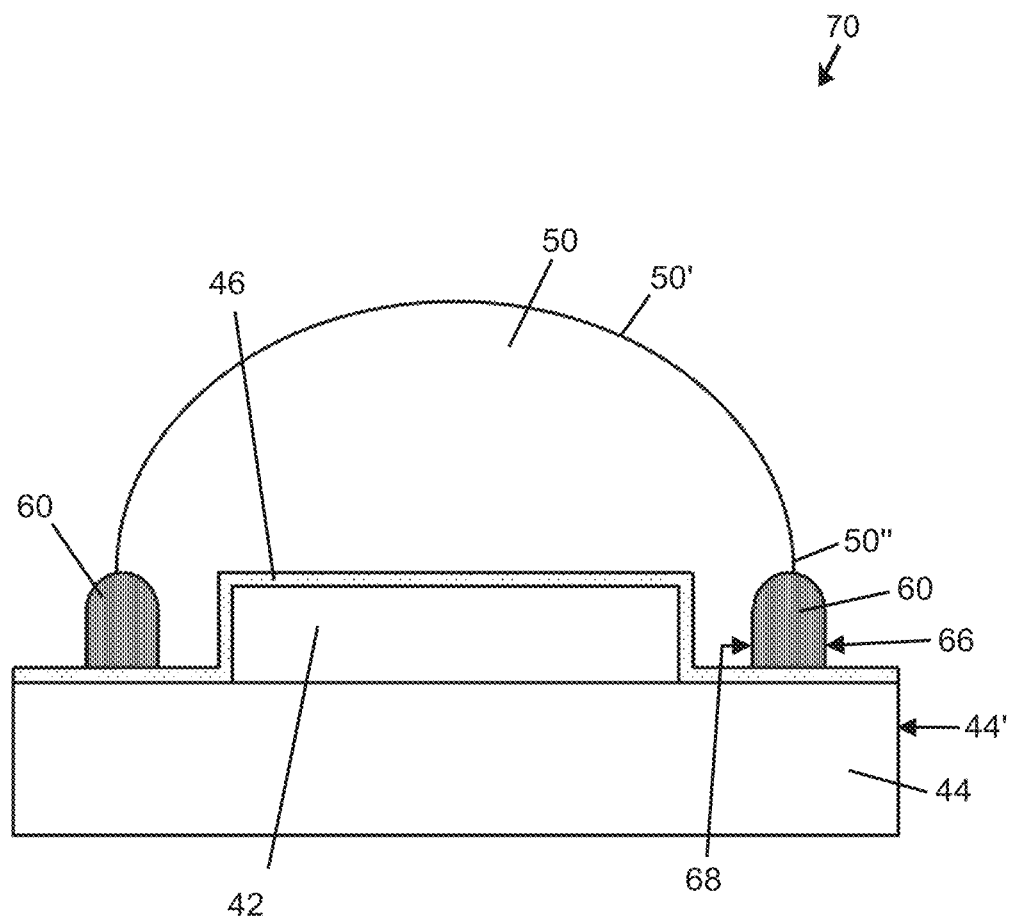
FIG._6

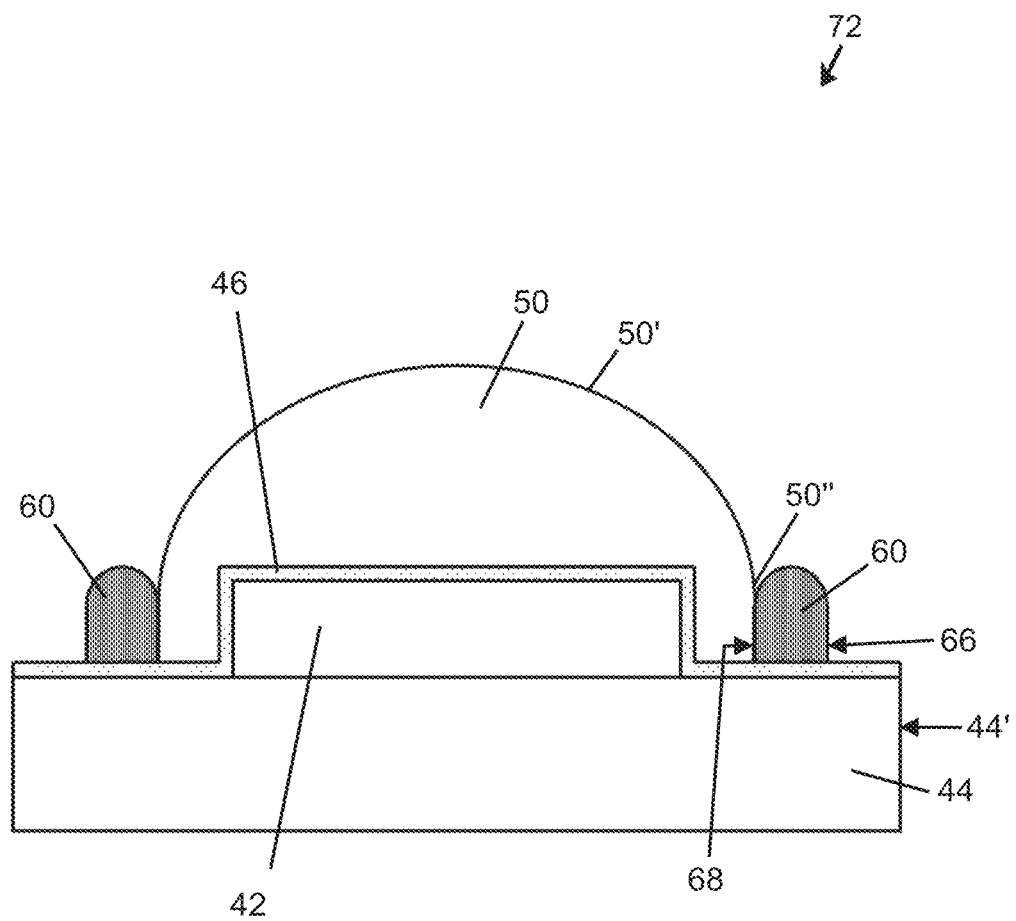
FIG._7

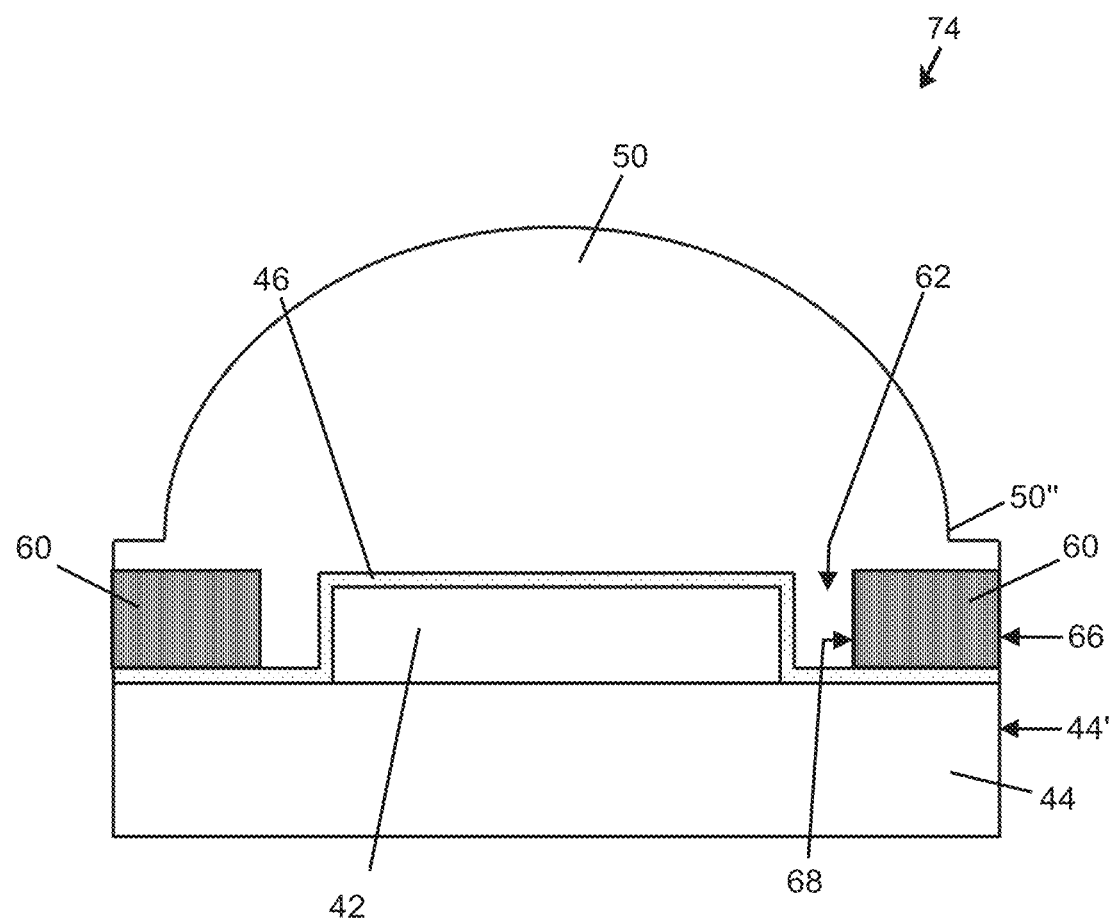
FIG._8A

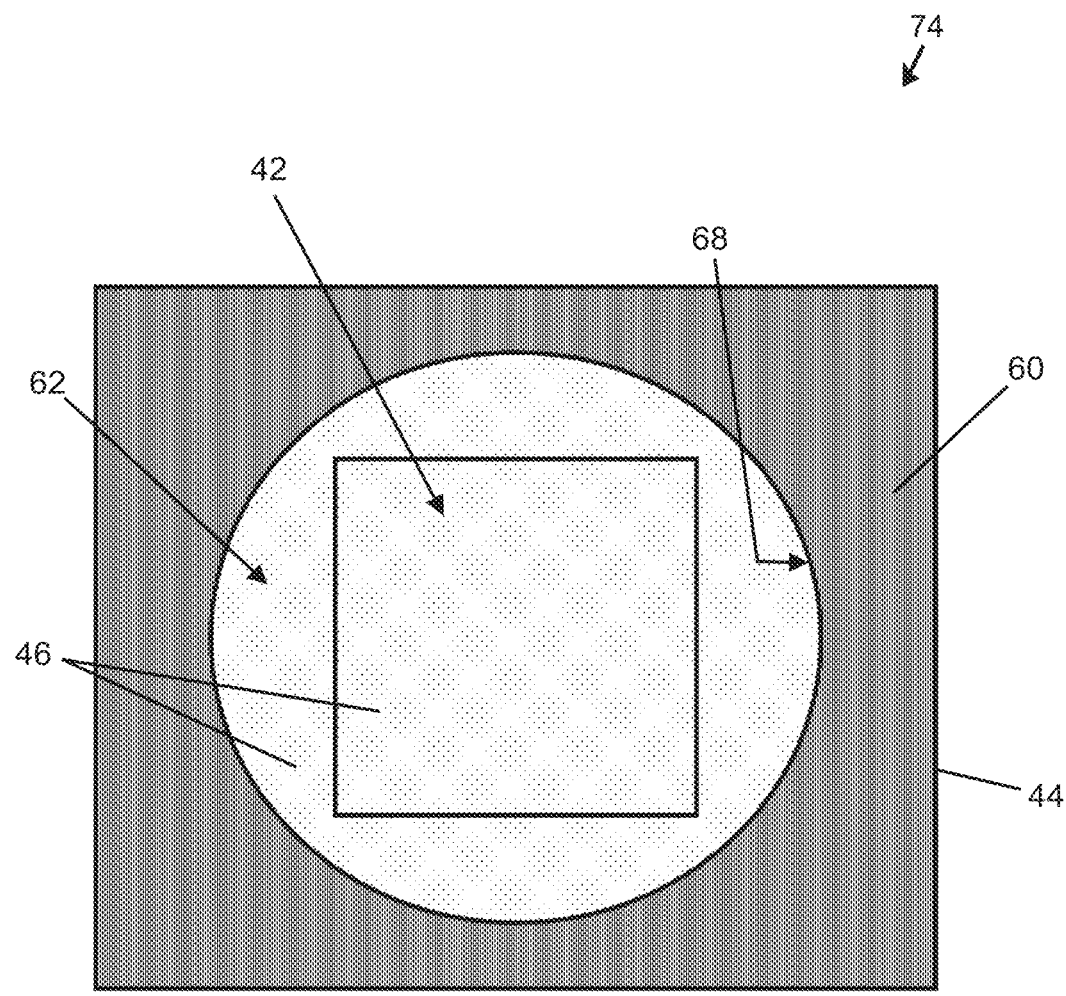
FIG._8B

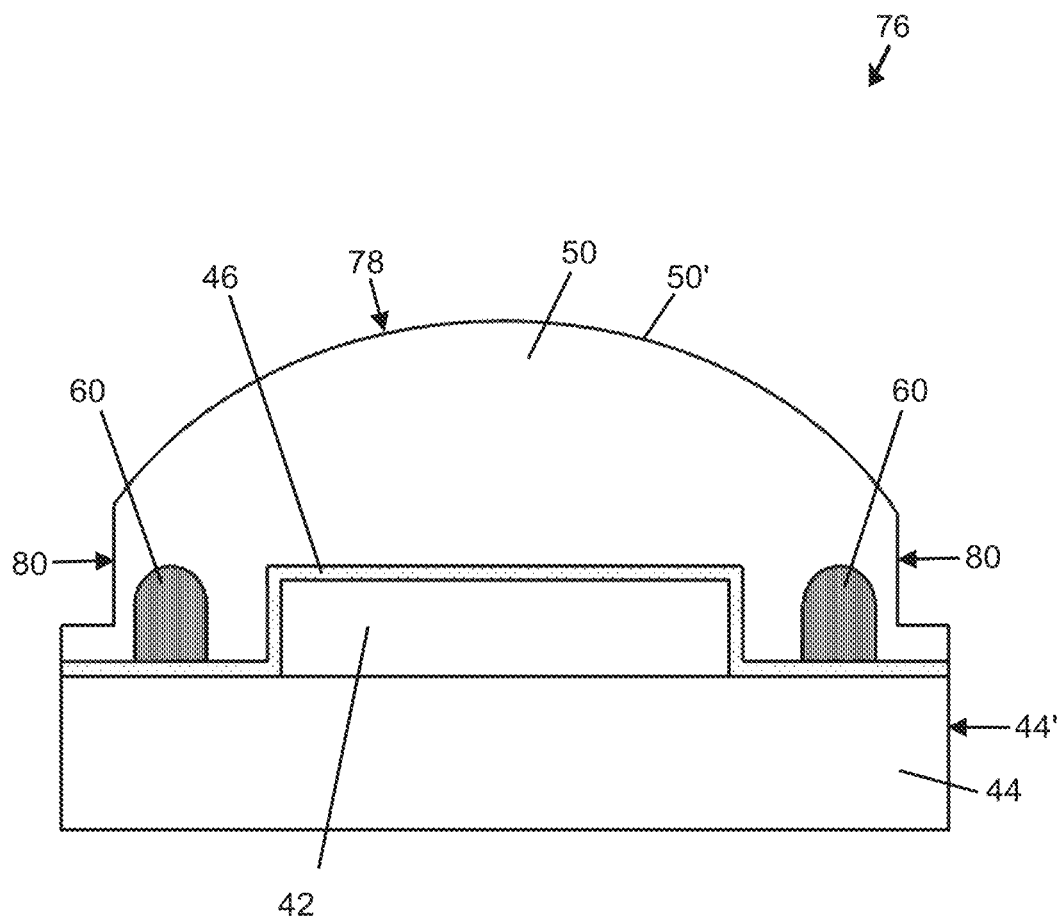
FIG._9A

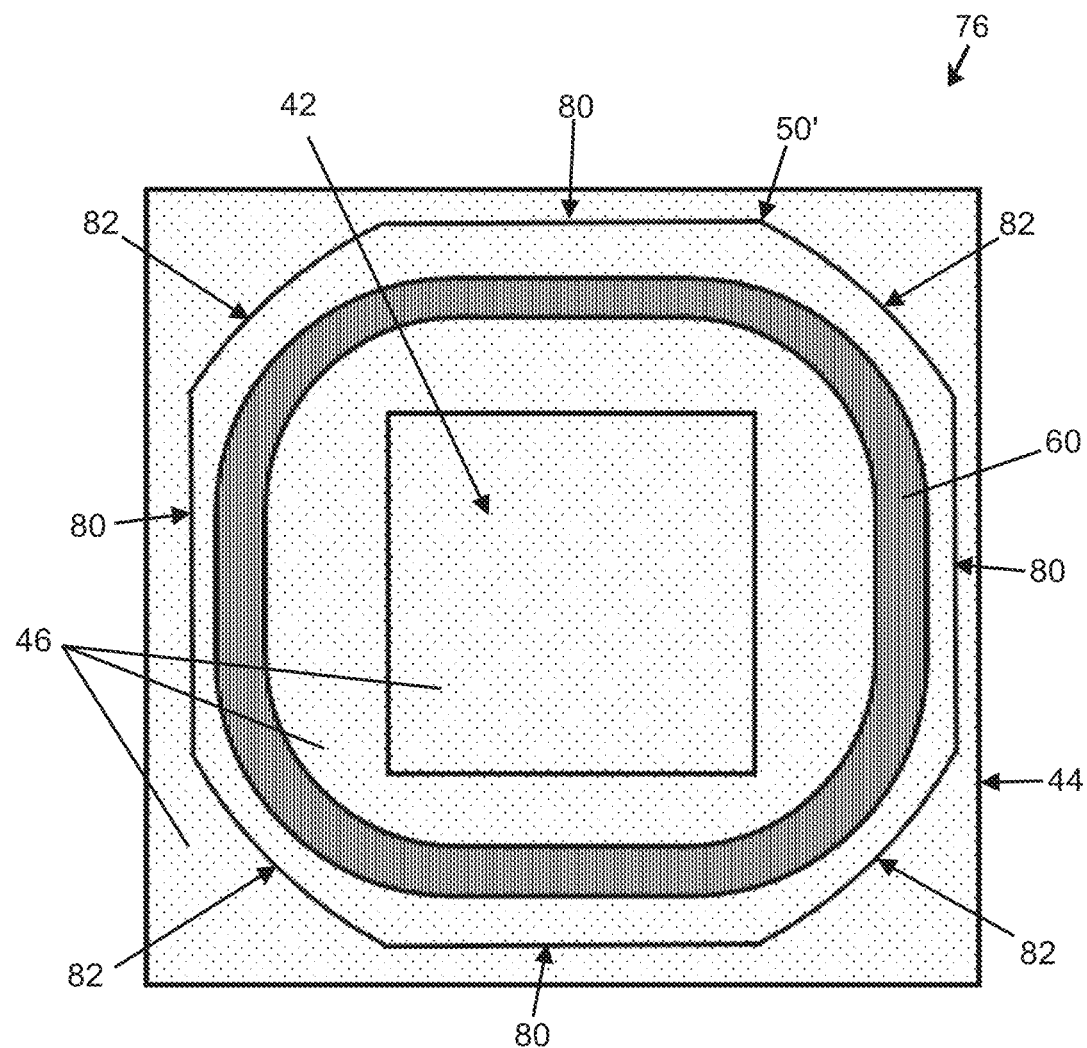
FIG._9B

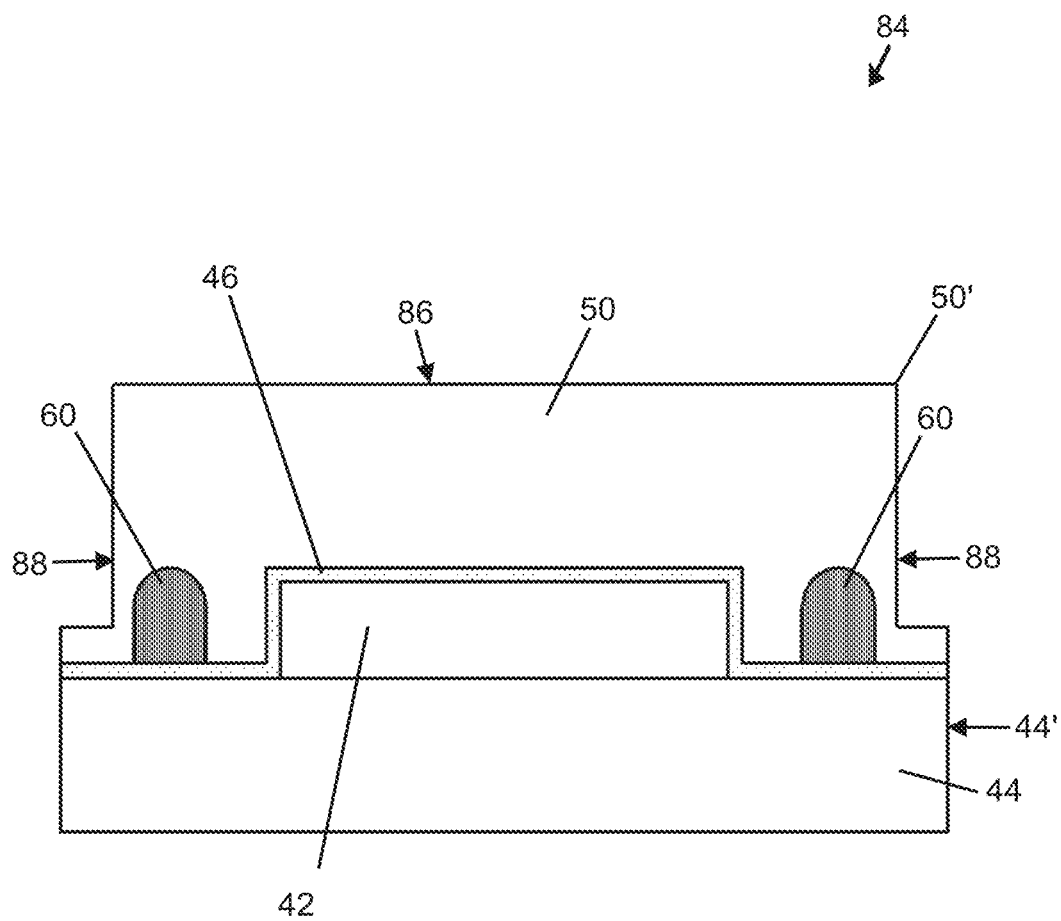
FIG._10

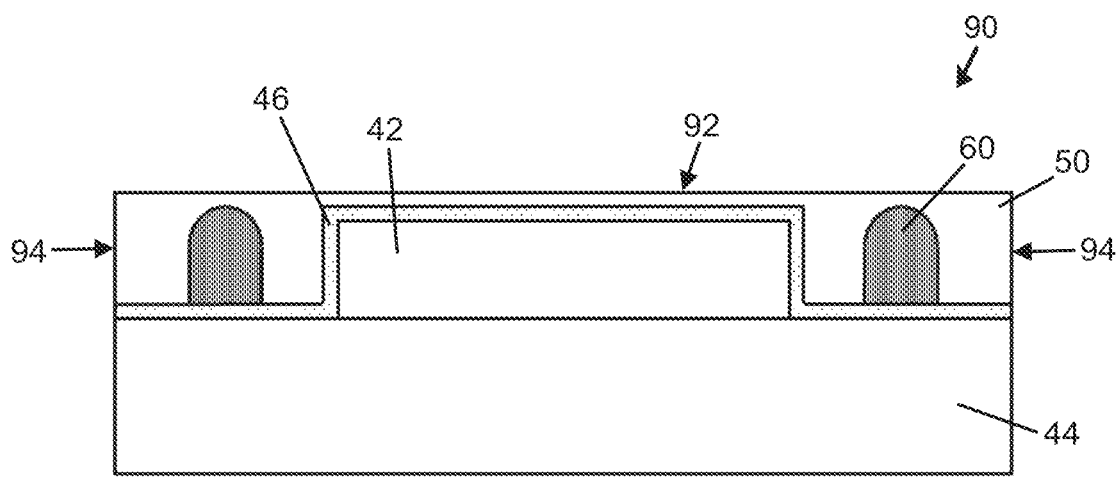
FIG._11A
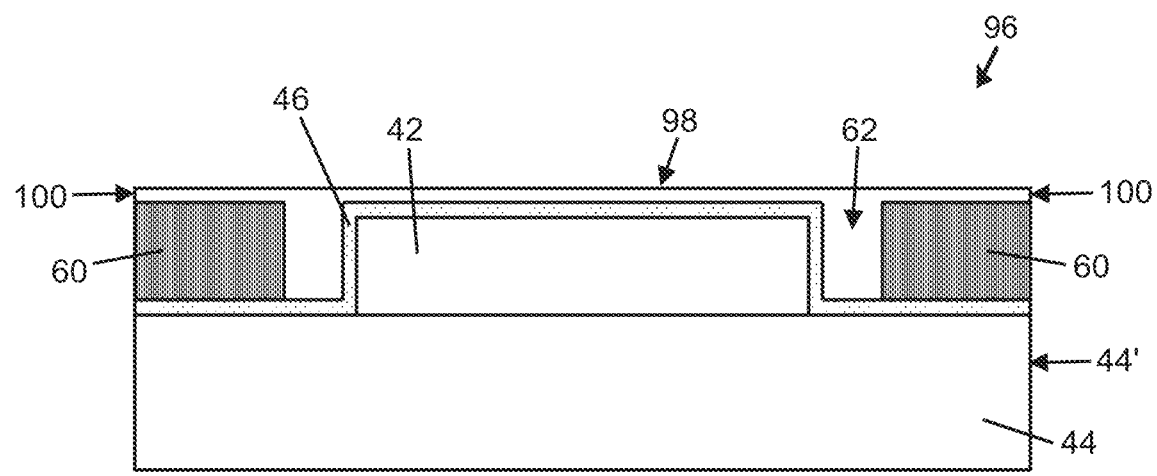
FIG._11B

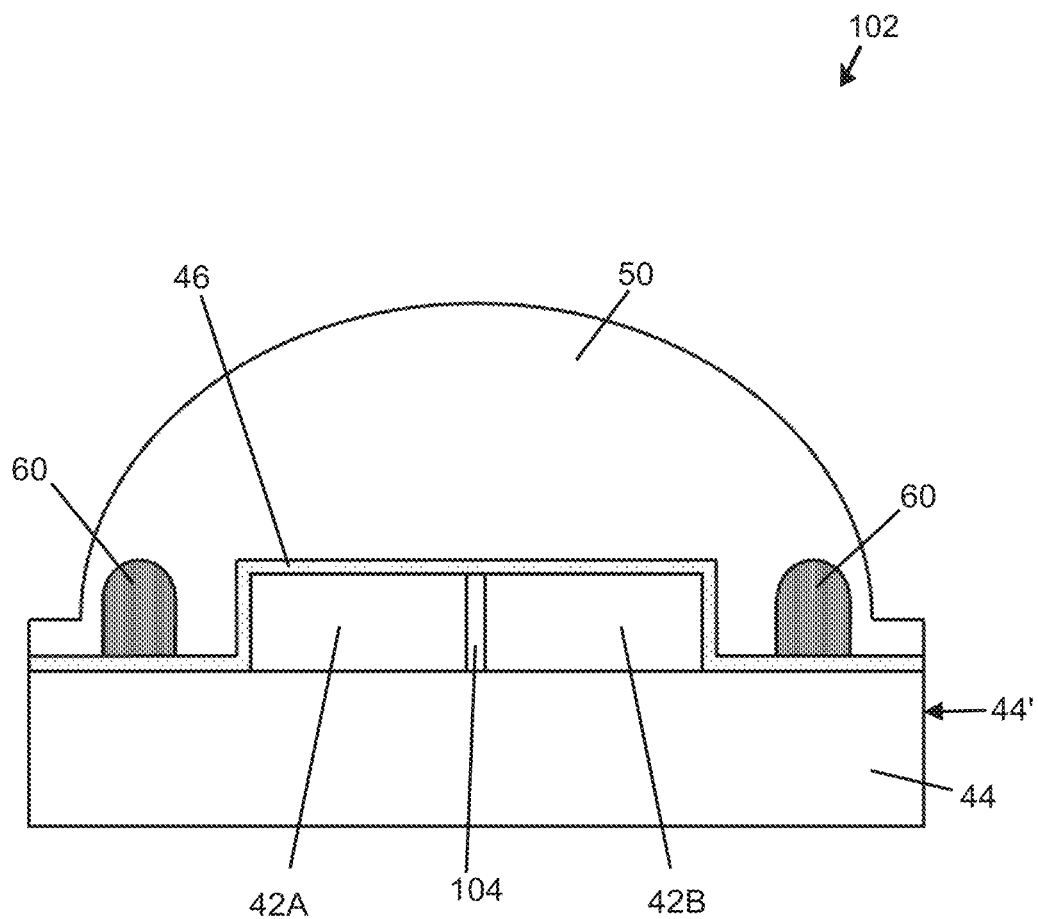
FIG._12

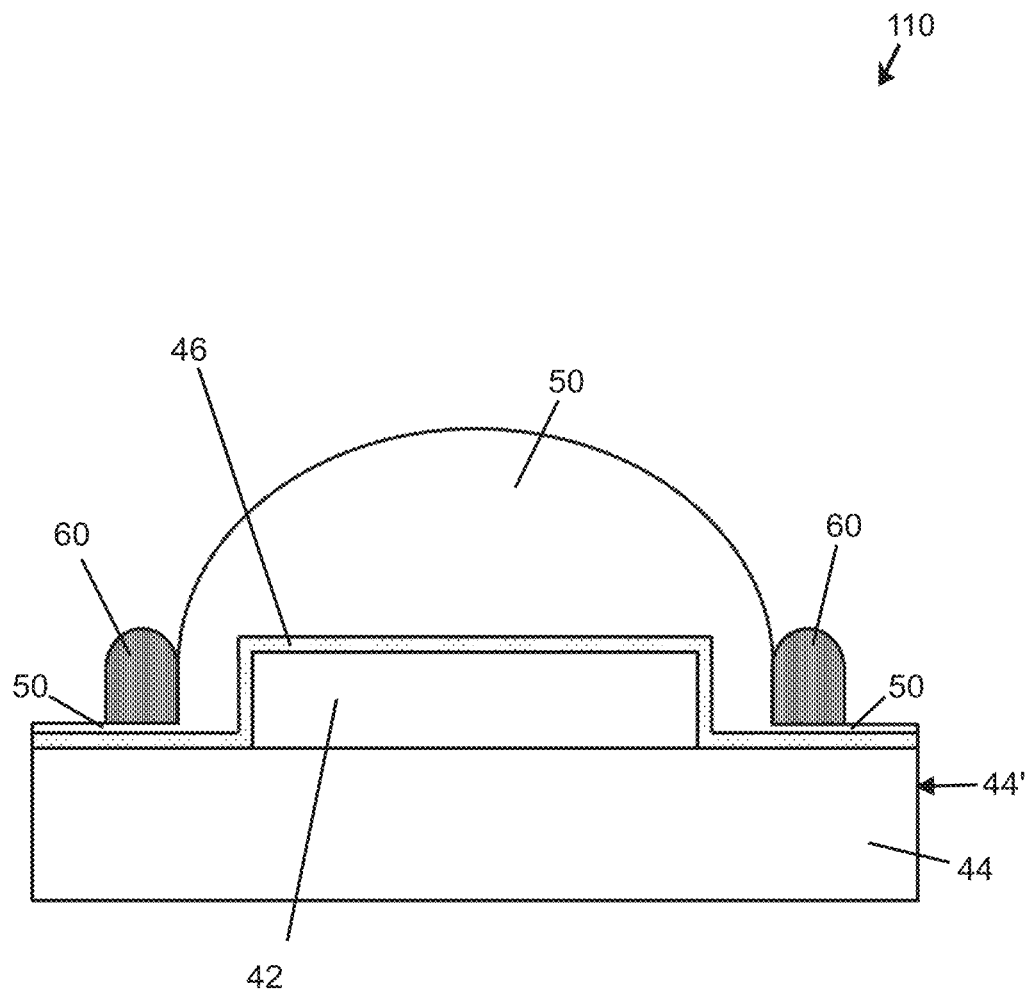
FIG._15

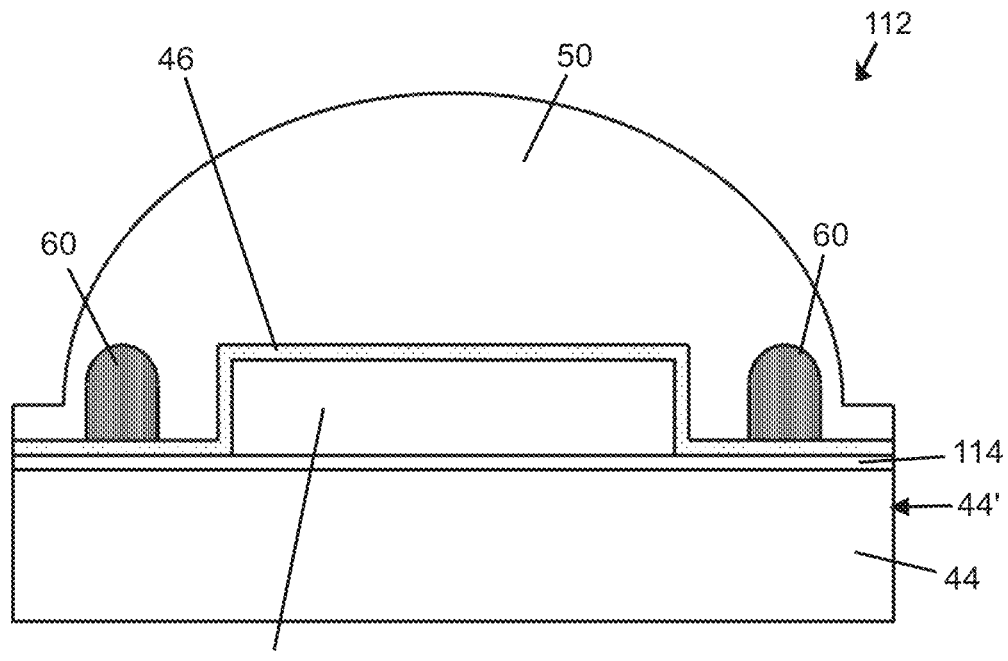
FIG._16A
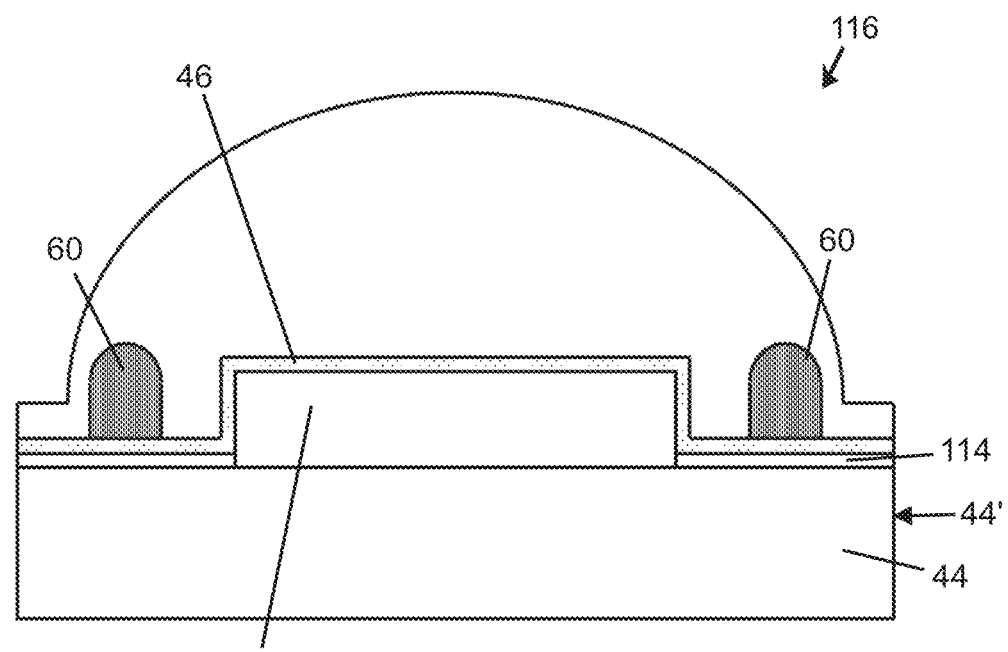
FIG._16B

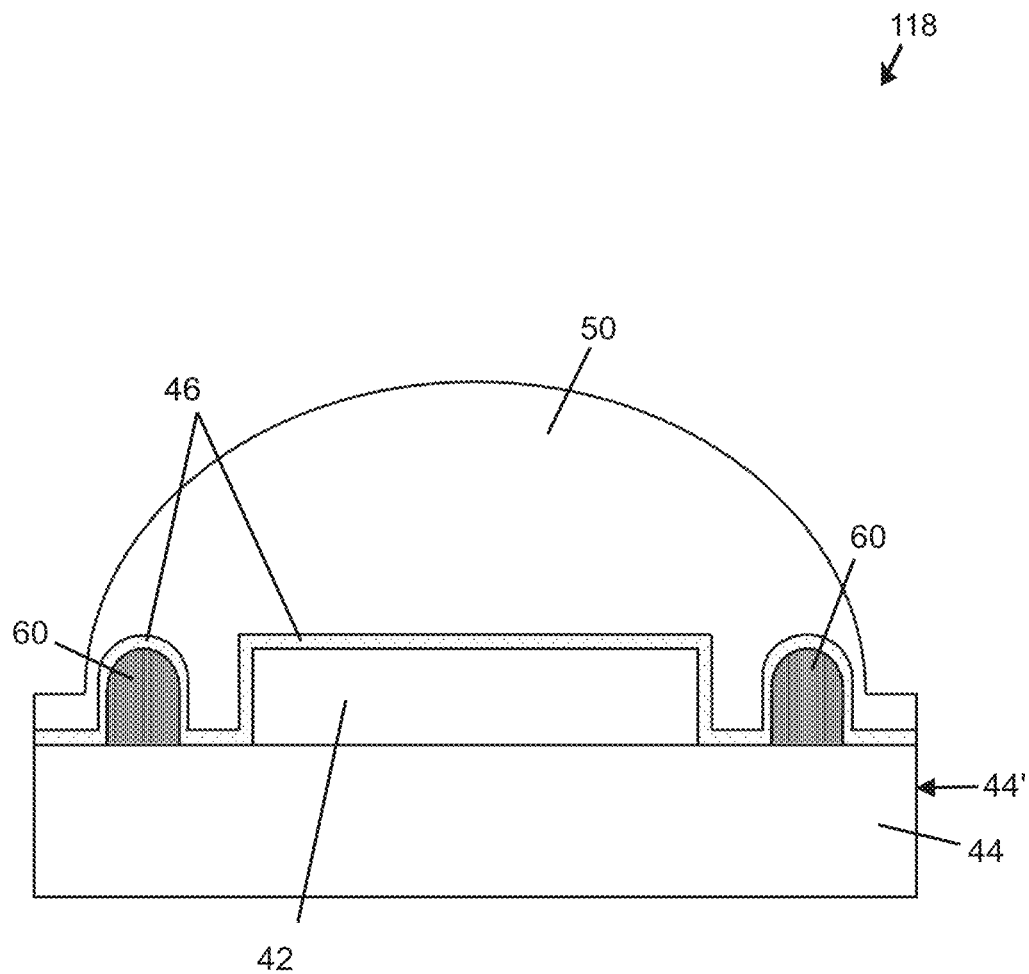
FIG._17

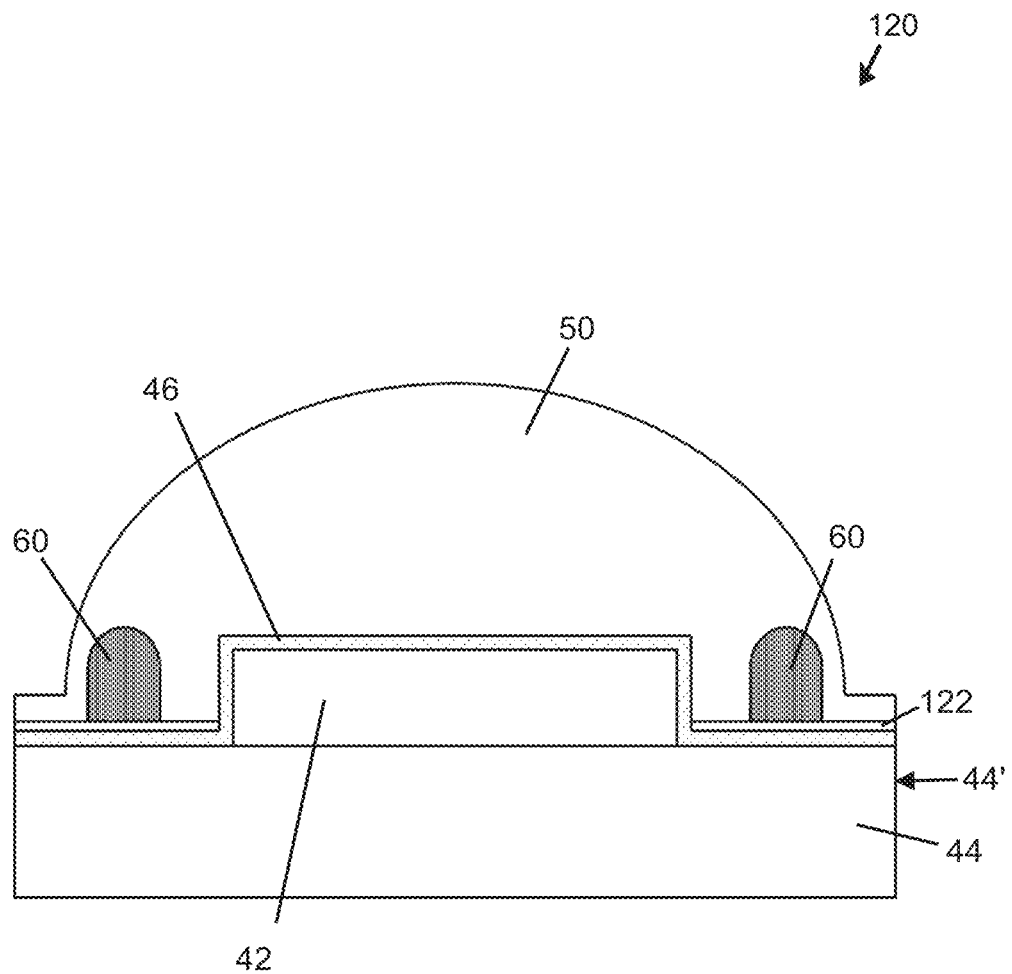
FIG._18

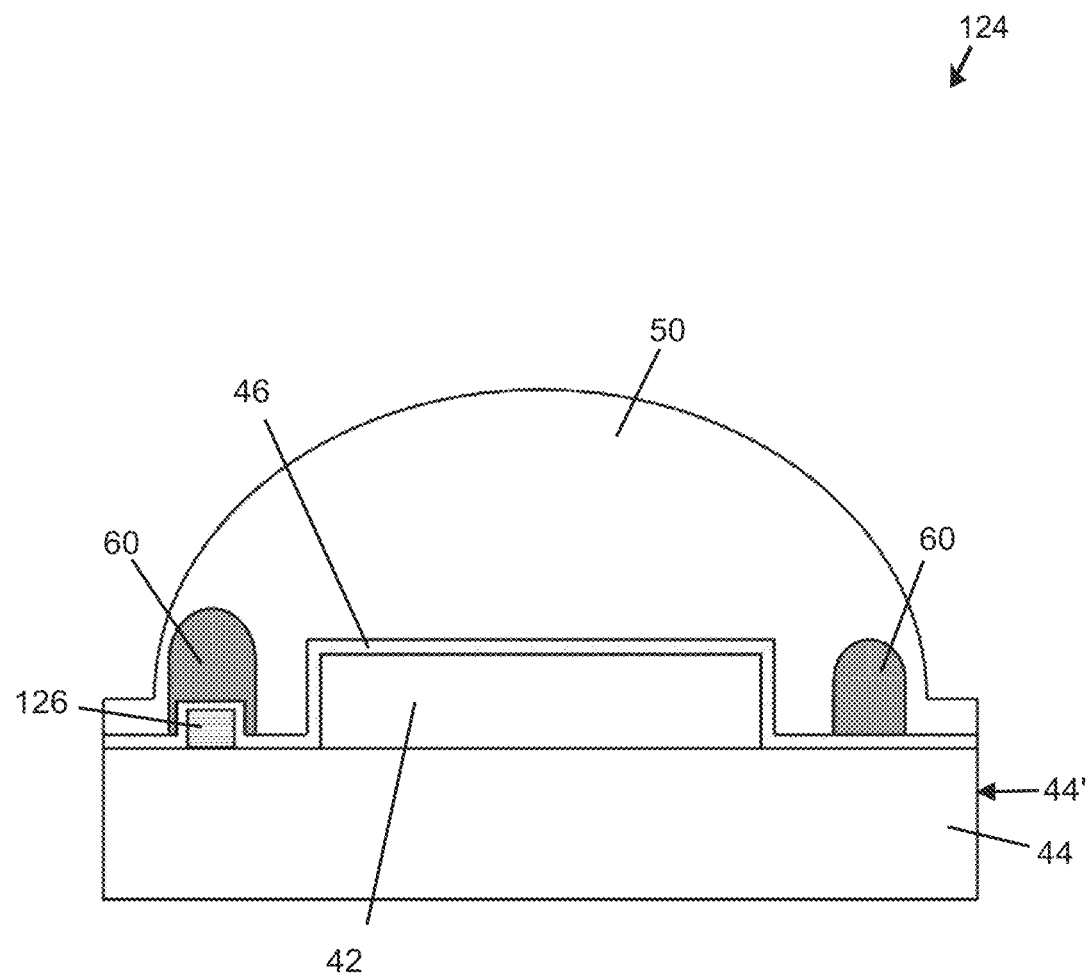
FIG._19

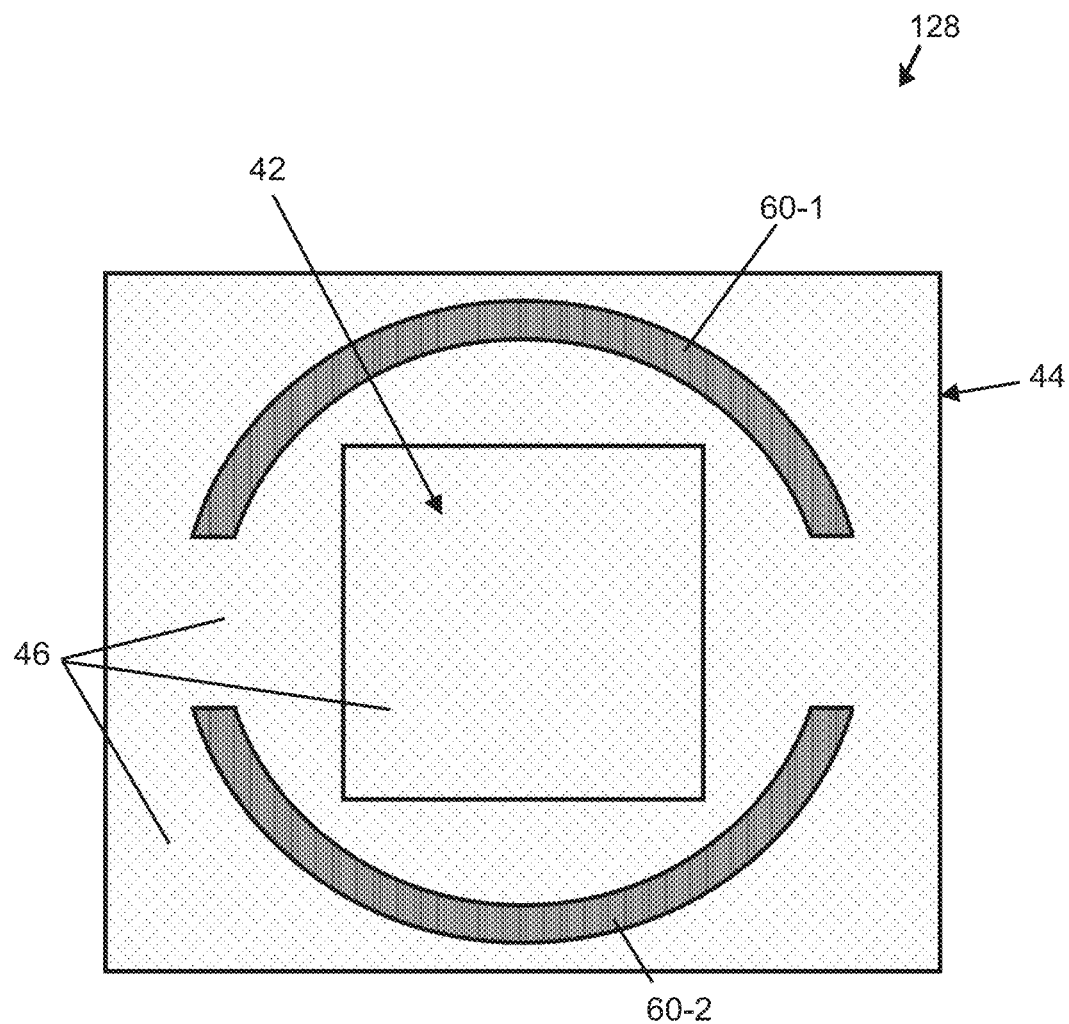
FIG._20

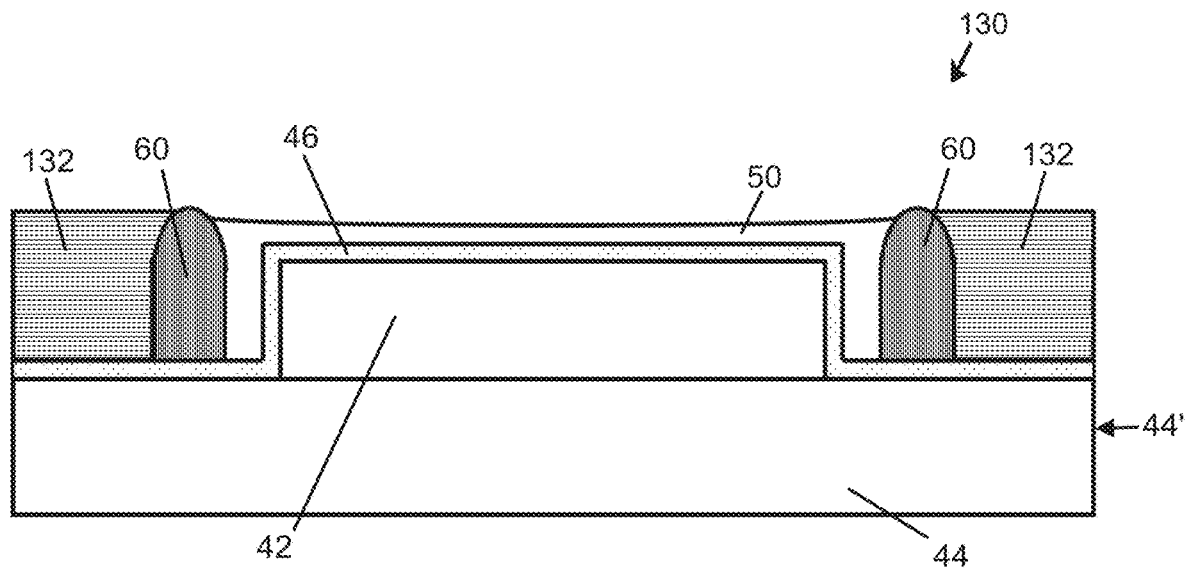
FIG._21
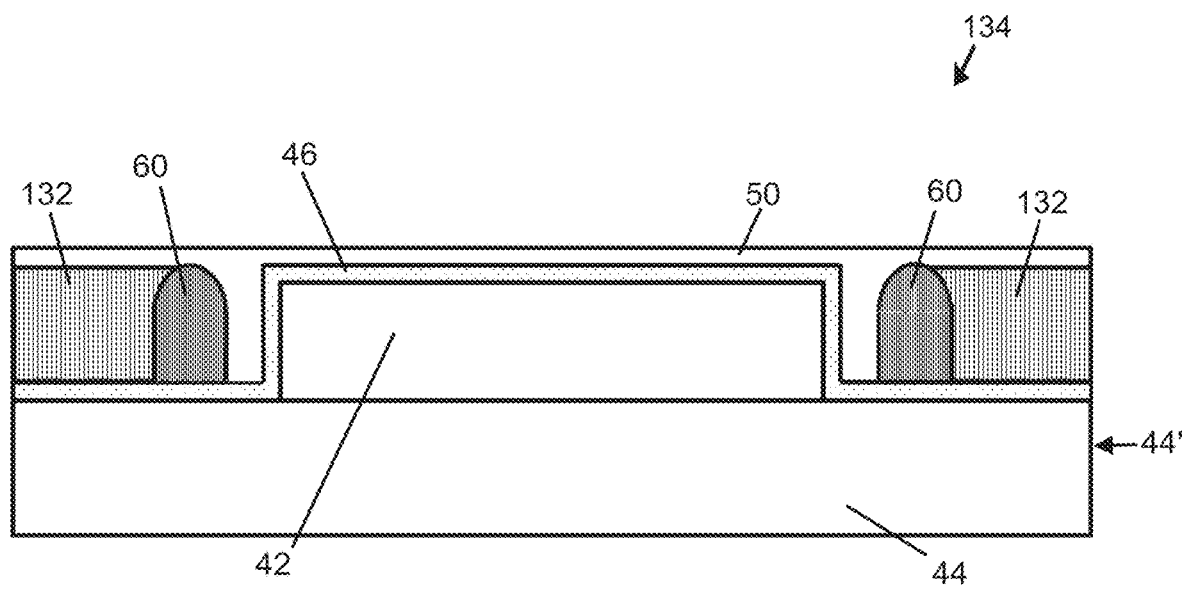
FIG._22

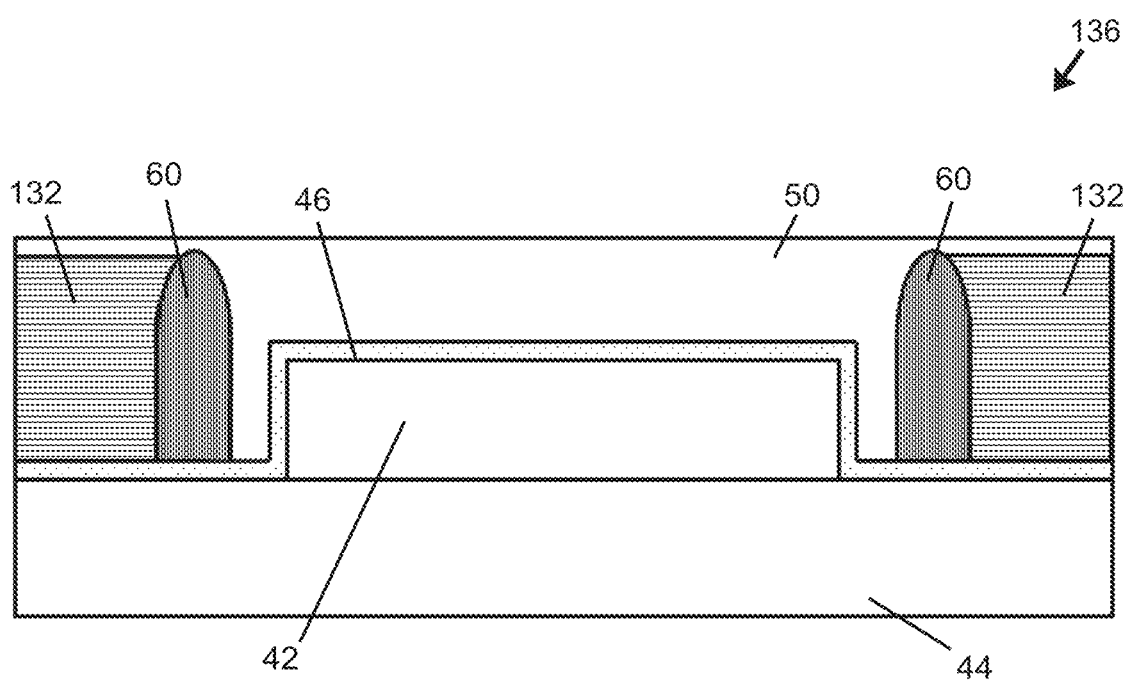
FIG._23

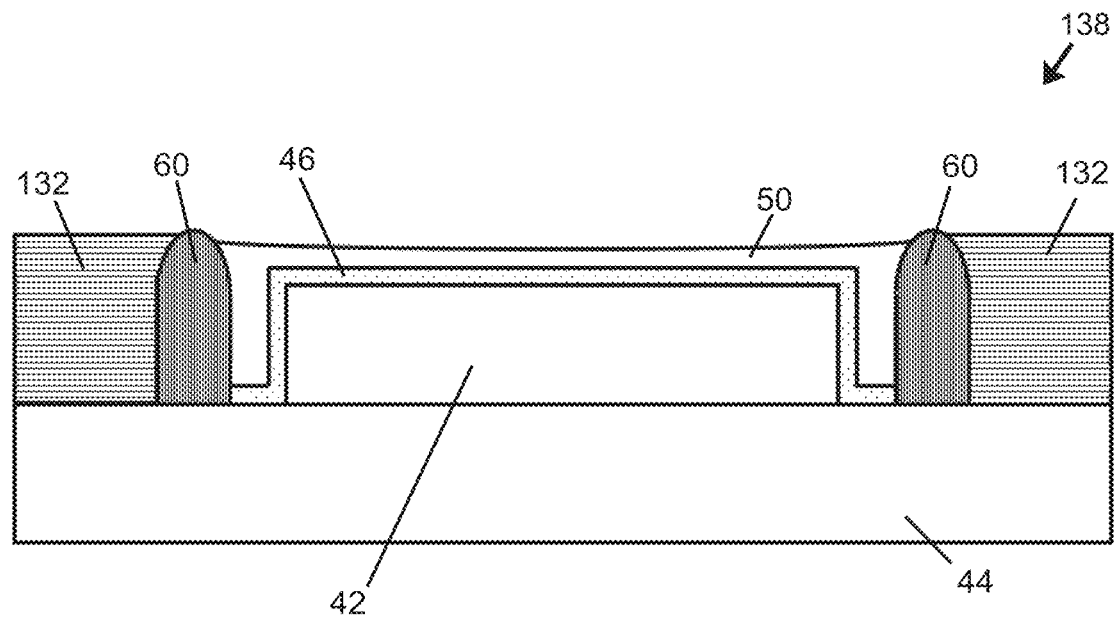
FIG._24
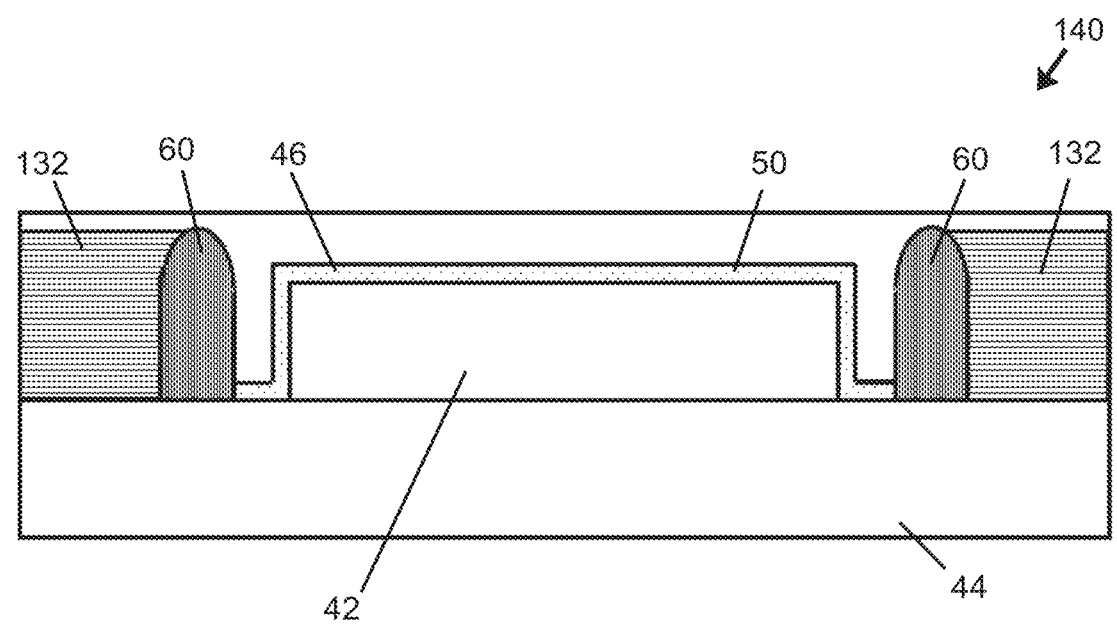
FIG._25

LIGHT-EMITTING DIODE PACKAGE WITH LIGHT-ALTERING MATERIAL

RELATED APPLICATION

This application is a division of U.S. patent application Ser. No. 16/686,457, filed on Nov. 18, 2019, issued as U.S. Pat. No. 10,811,573, which is a division of U.S. patent application Ser. No. 15/957,454, filed on Apr. 19, 2018, issued as U.S. Pat. No. 10,522,722, the disclosures of which are hereby incorporated herein by reference in their entireties.

FIELD OF THE DISCLOSURE

The present disclosure relates to solid-state lighting devices including light-emitting diodes, and more particularly to packaged light-emitting diodes with light-altering materials.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

Typically, it is desirable to operate LEDs at the highest light emission efficiency possible, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection. According to the well-understood implications of Snell's law, photons reaching the surface (interface) between an LED surface and the surrounding environment are either refracted or internally reflected. If photons are internally reflected in a repeated manner, then such photons eventually are absorbed and never provide visible light that exits an LED.

One way to increase light extraction efficiency is to provide reflective surfaces that reflect generated light so that such light may contribute to useful emission in a desired direction from an LED chip. In a typical LED package 10 illustrated in FIG. 1, a single LED chip 12 is mounted on a reflective cup 13 by means of a solder bond or conductive epoxy. One or more wire bonds 11 can connect the ohmic contacts of the LED chip 12 to leads 15A and/or 15B, which may be attached to or integral with the reflective cup 13. The reflective cup 13 may be filled with an encapsulant material 16, which may contain a wavelength conversion material such as a phosphor. At least some light emitted by the LED chip 12 at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected. Some light may be absorbed by the reflective cup 13 due to the less than 100% reflectivity of practical reflector surfaces. Some metals can have less than 95% reflectivity in the wavelength range of interest.

FIG. 2 shows another LED package 20 in which one or more LED chips 22 can be mounted onto a carrier such as a printed circuit board (PCB) carrier, substrate, or submount 23. A metal reflector 24 mounted on the submount 23 surrounds the LED chips 22 and reflects light emitted by the LED chips 22 away from the LED package 20. The reflector 24 also provides mechanical protection to the LED chips 22. One or more wire bond connections 11 are made between ohmic contacts on the LED chips 22 and electrical traces 25A, 25B on the submount 23. The mounted LED chips 22 are then covered with an encapsulant 26, which may provide environmental and mechanical protection to the LED chips 22 while also acting as a lens. The metal reflector 24 is typically attached to the carrier by means of a solder or epoxy bond. The metal reflector 24 may also experience optical losses when the light is reflected because it also has less than 100% reflectivity.

FIG. 3 shows another LED package 30 in which an LED 32 can be mounted on a submount 34 with a hemispheric lens 36 formed over it. The LED 32 can be coated by a conversion material that can convert all or most of the light from the LED 32. The hemispheric lens 36 is arranged to reduce total internal reflection of light. The lens 36 is made relatively large compared to the LED 32 so that the LED 32 approximates a point light source under the lens 36. As a result, an increased amount of LED light that reaches the surface of the lens 36 emits from the lens 36 on a first pass. Additionally, the lens 36 can be useful for directing light emission from the LED 32 in a desired emission pattern for the LED package 30.

The art continues to seek improved LEDs and solid-state lighting devices having reduced optical losses and providing desirable illumination characteristics capable of overcoming challenges associated with conventional lighting devices.

SUMMARY

The present disclosure relates to solid-state lighting devices including light-emitting diodes (LEDs) and more particularly to packaged LEDs with light-altering materials. In some embodiments, a light-altering material is provided in particular configurations within an LED package to redirect light from an LED chip and contribute to a desired emission pattern of the LED package. The light-altering material may also block light from the LED chip from escaping the LED package in a non-desirable direction, such as large or wide angle emissions.

In one aspect, an LED package includes a submount; at least one LED chip on the submount, wherein the at least one LED chip includes a first thickness measured in a direction perpendicular to the submount; a lumiphoric material arranged on the at least one LED chip and on at least a portion of the submount adjacent to the at least one LED chip; and a light-altering material on the lumiphoric material and adjacent to the at least one LED chip, wherein the light-altering material comprises a second thickness measured in a direction perpendicular to the submount; wherein the second thickness is greater than or equal to the first thickness. In certain embodiments, the LED package further comprises an encapsulant on the lumiphoric material and the light-altering material.

In another aspect, an LED package comprises: a submount; at least one LED chip on the submount, wherein the at least one LED chip comprises a first face mounted to the submount, a second face that generally opposes the first face, and a sidewall between the first face and the second face; a lumiphoric material arranged on the sidewall and on at least a portion of the submount adjacent to the at least one LED chip; and a light-altering material on the lumiphoric material and adjacent to the at least one LED chip; wherein the lumiphoric material on the sidewall is spaced from the light-altering material by a gap of at least 50 microns (μm). In certain embodiments, the light-altering material is spaced from the lumiphoric material on the sidewall by a gap of at least 100 μm, or in a range of about 50 μm to about 300 μm.

In another aspect, an LED package comprises: a submount; at least one LED chip on the submount; a lumiphoric material arranged on the at least one LED chip and on at least a portion of the submount adjacent to the at least one LED chip; a light-altering material on the lumiphoric material and adjacent to the at least one LED chip; and an encapsulant over the at least one LED chip, wherein the encapsulant comprises a shape that includes a lens with a lens base; wherein the light-altering material is registered with the lens base. In certain embodiments, the light-altering material comprises an outer face and an inner face that generally opposes the outer face, wherein the outer face is aligned with the lens base. The lens base may be aligned with the outer face, the inner face, or between the outer face and the inner face.

In some embodiments, an LED package comprises: a submount; at least one LED chip on the submount; a lumiphoric material arranged on the at least one LED chip and on at least a portion of the submount adjacent to the at least one LED chip; and a light-altering material on the lumiphoric material and adjacent to the at least one LED chip, wherein a highest elevation position of the light-altering material relative to the submount is greater than a highest elevation position of the lumiphoric material relative to the submount.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 illustrates a cross-sectional representation of a conventional light-emitting diode (LED).

FIG. 2 illustrates a cross-sectional representation of a conventional LED.

FIG. 3 illustrates a cross-sectional representation of a conventional LED.

FIG. 4A illustrates a cross-sectional view of an LED package according to some embodiments.

FIG. 4B illustrates a cross-sectional view of the LED package of FIG. 4A according to some embodiments.

FIG. 4C illustrates a top view of the LED package of FIG. 4A without the encapsulant according to some embodiments.

FIG. 6 illustrates a cross-sectional view of an LED package according to some embodiments.

FIG. 7 illustrates a cross-sectional view of an LED package according to some embodiments.

FIG. 8A illustrates a cross-sectional view of an LED package according to some embodiments.

FIG. 8B illustrates a top view of the LED package of FIG. 8A without the encapsulant according to some embodiments.

FIG. 9A illustrates a cross-sectional view of an LED package that includes an encapsulant with a hemispheric or curved top portion and planar side surfaces according to some embodiments.

FIG. 9B illustrates a top view of the LED package of FIG. 9A according to some embodiments.

FIG. 10 illustrates a cross-sectional view of an LED package that includes an encapsulant with a planar top surface and planar side surfaces according to some embodiments.

FIG. 11A illustrates a cross-sectional view of an LED package that includes an encapsulant with a planar top surface and planar side surfaces according to some embodiments.

FIG. 11B illustrates a cross-sectional view of an LED package that includes an encapsulant with a planar top surface and planar side surfaces according to some embodiments.

FIG. 12 illustrates a cross-sectional view of an LED package that includes a plurality of LED chips according to some embodiments.

FIG. 15 illustrates a cross-sectional view of an LED package according to some embodiments.

FIG. 16A illustrates a cross-sectional view of an LED package according to some embodiments.

FIG. 16B illustrates a cross-sectional view of an LED package according to other embodiments.

FIG. 17 illustrates a cross-sectional view of an LED package according to some embodiments.

FIG. 18 illustrates a cross-sectional view of an LED package according to some embodiments.

FIG. 19 illustrates a cross-sectional view of an LED package according to some embodiments.

FIG. 20 illustrates a top view of an LED package according to some embodiments.

FIG. 21 illustrates a cross-sectional view of an LED package according to some embodiments.

FIG. 22 illustrates a cross-sectional view of an LED package according to some embodiments.

FIG. 23 illustrates a cross-sectional view of an LED package according to some embodiments.

FIG. 24 illustrates a cross-sectional view of an LED package according to some embodiments.

FIG. 25 illustrates a cross-sectional view of an LED package according to some embodiments.

DETAILED DESCRIPTION

Figure 4D:
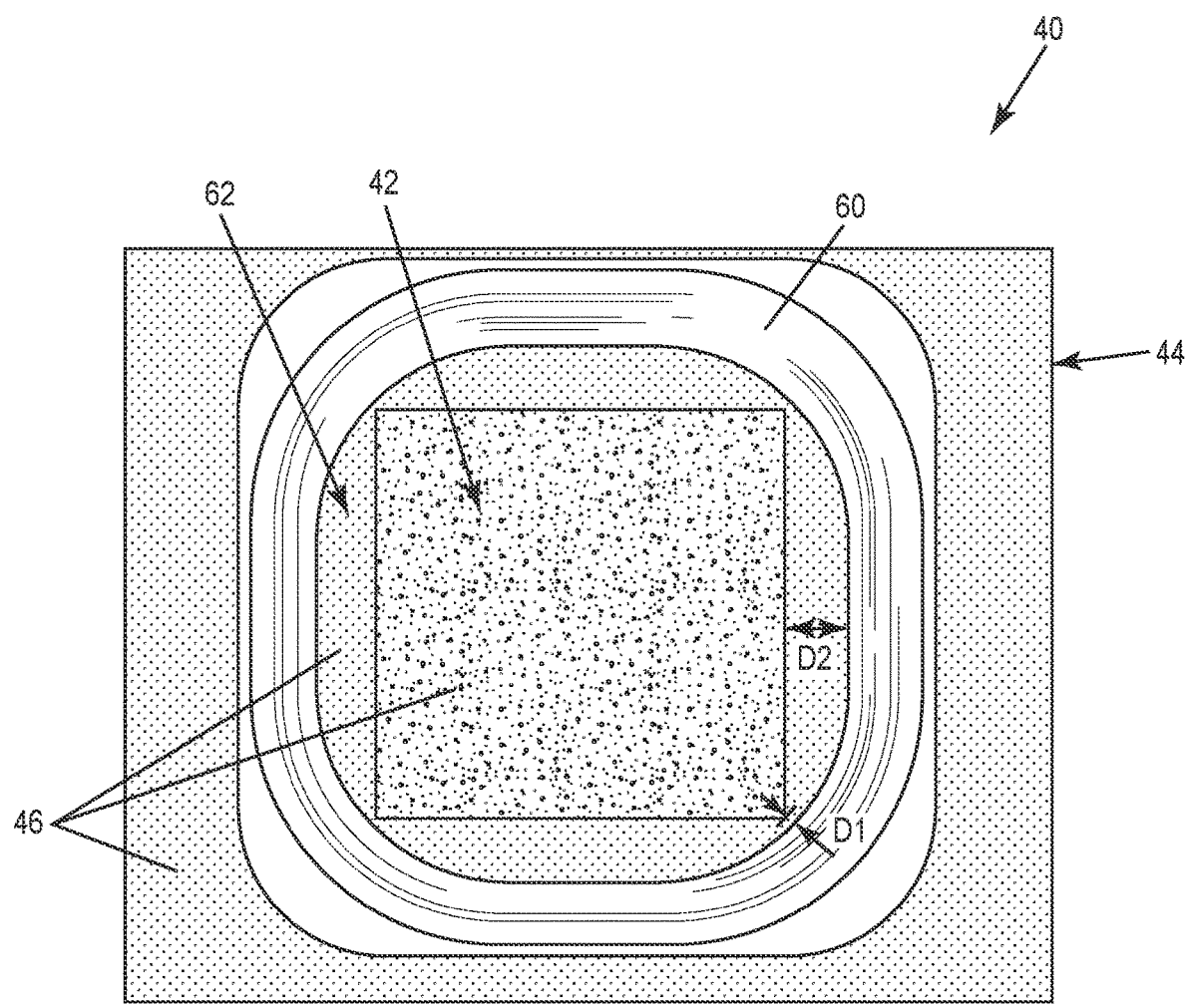
FIG. 4D is a photographic image of an LED package taken from a top view similar to the illustration of FIG. 4C.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to solid-state lighting devices including light-emitting diodes (LEDs) and more particularly to packaged LEDs with light-altering materials. In some embodiments, a light-altering material is provided in particular configurations within an LED package to redirect light from an LED chip and contribute to a desired emission pattern of the LED package. The light-altering material may also block light from the LED chip from escaping the LED package in a non-desirable direction, such as large or wide angle emissions.

An LED chip typically comprises an active LED structure or region that can have many different semiconductor layers arranged in different ways. The fabrication and operation of LEDs and their active structure are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including but not limited to, buffer layers; nucleation layers; super lattice structures; un-doped layers; cladding layers; contact layers; and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide, organic semiconductor materials, and other Group III-V systems such as gallium phosphide, gallium arsenide, and related compounds.

The active LED structure may be grown on a growth substrate that can include many materials, such as sapphire, silicon carbide, aluminum nitride (AlN), GaN, with a suitable substrate being a 4H polytype of silicon carbide, although other silicon carbide polytypes can also be used including 3C, 6H, and 15R polytypes. Silicon carbide has certain advantages, such as a closer crystal lattice match to Group III nitrides than other substrates and results in Group III nitride films of high quality. Silicon carbide also has a very high thermal conductivity so that the total output power of Group III nitride devices on silicon carbide is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure can emit different wavelengths of light depending on the composition of the active layer and n-type and p-type layers. In some embodiments, the active LED structure emits a blue light in a peak wavelength range of approximately 430 (nanometers) nm to 480 nm. In other embodiments, the active LED structure emits green light in a peak wavelength range of 500 nm to 570 nm. In other embodiments, the active LED structure emits red light in a peak wavelength range of 600 to 650 nm. The LED chip can also be covered with one or more lumiphors or other conversion materials, such as phosphors, such that at least some of the light from the LED passes through the one or more phosphors and is converted to one or more different wavelengths of light. In some embodiments, the LED chip emits a generally white light combination of light from the active LED structure and light from the one or more phosphors. The one or more phosphors may include yellow (e.g., YAG:Ce), green (LuAg:Ce), and red ($Ca_{i-x-y}Sr_xEu_yAlSiN_3$) emitting phosphors, and combinations thereof.

Light emitted by the active layer or region of the LED chip is typically omnidirectional in character. For directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer is arranged between the metal reflector layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected from the reflector surface travels back through the active LED structure and may be absorbed by other layers or elements within the LED chip.

As used herein, a layer or region of a light-emitting device may be considered to be "transparent" when at least 90% of emitted radiation that impinges on the layer or region emerges through the layer or region. Moreover, as used herein, a layer or region of an LED is considered to be "reflective" or embody a "mirror" or a "reflector" when at least 90% of the angle averaged emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (for example, at least 90% reflective) may be considered a reflective material. In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. A vertical geometry LED typically includes an anode and cathode on opposing sides of the active LED structure. A lateral geometry LED chip typically includes an anode and a cathode on the same side of the active LED structure that is opposite a substrate, such as a growth substrate or a carrier substrate. In some embodiments, a lateral geometry LED chip may be mounted on a submount of an LED package such that the anode and cathode are on a face of the active LED structure that is opposite the submount. In this configuration, wirebonds may be used to provide electrical connections with the anode and cathode. In other embodiments, a lateral geometry LED chip may be flip-chip mounted on a submount of an LED package such that the anode and cathode are on a face of the active LED structure that is adjacent to the submount. In this configuration, electrical traces or patterns may be provided on the submount for providing electrical connections to the anode and cathode of the LED chip. In a flip-chip configuration, the active LED structure is configured between the substrate of the LED chip and the submount for the LED package. Accordingly, light emitted from the active LED structure may pass through the substrate in a desired emission direction. In some embodiments, the flip-chip LED chip may be configured as described in commonly-assigned U.S. Publication No. 2017/0098746, which is hereby incorporated by reference herein. In some embodiments, an LED package may be configured as set forth in the following commonly-assigned U.S. patents and U.S. publications, which are hereby incorporated by reference herein: U.S. Pat. Nos. 8,866,169; 9,070,850; 9,887,327; and U.S. Publication No. 2015/0179903.

Embodiments of the disclosure are described herein with reference to cross-sectional view illustrations that are schematic illustrations of embodiments of the disclosure. As such, the actual thickness of the layers can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure.

FIG. 4A illustrates a cross-sectional view of an LED package 40 according to some embodiments. The LED package 40 includes an LED chip 42 on a submount 44. In some embodiments, the LED chip 42 generally includes an active LED structure and a substrate, such as a growth substrate, as previously described. The submount 44 can be formed of many different materials with a preferred material being electrically insulating. Suitable materials include, but are not limited to ceramic materials such as aluminum oxide or alumina, aluminum nitride, or organic insulators like polyimide (PI) and polyphthalamide (PPA). In other embodiments the submount 44 can comprise a printed circuit board (PCB), sapphire, silicon or any other suitable material. For PCB embodiments different PCB types can be used such as standard FR-4 PCB, metal core PCB, or any other type of PCB. LED packages according to the present disclosure can be fabricated using a method that utilizes a submount panel sized to accommodate a plurality of submounts. Multiple LED packages can be formed on the panel, with individual packages being singulated from the panel. The LED chip 42 can be mounted to the submount 44 using known methods and material mounting such as using conventional solder materials that may or may not contain a flux material or dispensed polymeric materials that may be thermally and electrically conductive, as well as other methods and material mounting such as solderless, direct attach, or other conventional attachment means.

A lumiphoric material 46 is arranged on the LED chip 42 and on a surface 48 of the submount 44 that is adjacent to the LED chip 42. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, spray coating, inkjet printing, or the like). In certain embodiments, lumiphoric materials may be deposited utilizing one or more applications of a spray coating after the LED chip 42 is mounted on the submount 44, as described in commonly-assigned U.S. Publication No. 2017/0098746. In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In some embodiments, one or more phosphors may include yellow phosphor (e.g., YAG:Ce), green phosphor (LuAg:Ce), and red phosphor ($Ca_{1-x-y}Sr_xEu_yAlSiN_3$) and combinations thereof.

One or more lumiphoric materials may be provided on one or more portions of an LED chip and/or a submount in various configurations. In certain embodiments, one or more surfaces of LED chips may be conformally coated with one or more lumiphoric materials, while other surfaces of such LEDs and/or associated submounts may be devoid of lumiphoric material. In certain embodiments, a top surface of an LED chip may include lumiphoric material, while one or more side surfaces or sidewalls of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of a flip-chip LED. In certain embodiments, one or more lumiphoric materials may be patterned on portions of one or more surfaces of a flip-chip LED to include one or more stripes, dots, curves, or polygonal shapes. In certain embodiments, multiple lumiphoric materials may be arranged in different discrete regions or discrete layers on or over an LED chip.

The LED package 40 further includes an encapsulant 50 that may provide both environmental and/or mechanical protection for the LED chip 42. The encapsulant 50 may also be referred to as an encapsulant layer. Many different materials can be used for the encapsulant 50, including silicones, plastics, epoxies or glass, with a suitable material being compatible with molding processes. Silicone is suitable for molding and provides suitable optical transmission properties for light emitted from the LED chip 42. In some embodiments, the encapsulant 50 can be molded into the shape of a lens 50' that includes a lens base 50". Different molding techniques may provide the lens 50' and the lens base 50" with many different shapes depending on the desired shape of the light output. One suitable shape as shown in FIG. 4A is hemispheric, with some examples of alternative shapes being ellipsoid bullet, flat, hex-shaped and square. In some embodiments, a suitable shape includes both curved and planar surfaces, such as a hemispheric top portion with planar side surfaces. It is understood that the encapsulant 50 can also be textured to improve light extraction or contain materials such as phosphors or scattering particles. The LED package 40 can also comprise a protective layer 52 that covers any portion of the submount 44 that is not covered by the shape of the lens 50' of the encapsulant 50. The protective layer 52 provides additional protection to the elements on the top surface to reduce damage and contamination during subsequent processing steps and use. In some embodiments, the protective layer 52 is an extension of the encapsulant 50 and comprises the same material as the encapsulant 50. It is understood, however, that the LED package 40 can also be provided without the protective layer 52.

The LED chip 42 includes a first face 54 mounted to the submount 44, a second face 56 that generally opposes the first face 54, and at least one sidewall 58 between the first face 54 and the second face 56. As previously described, light emitted from the active LED structure of the LED chip 42 may be omnidirectional in nature and accordingly, light may transmit or escape the LED chip 42 from at least the second face 56 and the at least one sidewall 58. The luminous intensity of light provided by the LED package 40 may be measured and characterized as a spatial distribution across a range of emission angles relative to the LED package 40. As illustrated in FIG. 4, an emission angle of 0° is normal to the first face 54 and an emission angle of 90° or −90° is parallel to the first face 54. In typical applications, it is desirable for the LED package 40 to provide a majority of luminous intensity of light within a certain range of emission angles from 0°, such a range of −65° to 65°, or −60° to 60°, or −50° to 50°, or −45° to 45°, and so on. Accordingly, it is also desirable to reduce the amount of light that emits at high emission angles (which may also be referred to as large or wide emission angles), such as a range of 65° to 90° and −65° to −90°, or −70° to −90° and 70° to 90°, or −80° to −90° and 80° to 90°. In that regard, the LED package 40 includes a light-altering material 60 that in some embodiments is configured to redirect or reflect light away from high emission angles toward the desired range of emission angles. In other embodiments, the light-altering material 60 may block or absorb light from the LED chip 42 that would otherwise escape the LED package 40 with high emission angles. In some embodiments, the light-altering material 60 is arranged around a perimeter of the LED chip 42 on the submount 44. Additionally, the light-altering material 60 may partially cover the submount 44 outside of where the LED chip 42 is located.

The light-altering material 60 may be adapted for dispensing, or placing, and may include many different materials including light-reflective materials that reflect or redirect light, light-absorbing materials that absorb light, and materials that act as a thixotropic agent. In some embodiments, the light-altering material 60 may include fused silica, fumed silica, and titanium dioxide (TiO$_2$) particles suspended in a binder, such as silicone or epoxy. In some embodiments, the light-altering material 60 may comprise a white color to reflect and redirect light. In other embodiments, the light-altering material 60 may comprise an opaque or black color for absorbing light and increasing contrast of the LED package 40. The light-altering material 60 can be dispensed or deposited in place using an automated dispensing machine where any suitable size and/or shape can be formed. In FIG. 4A, the light-altering material 60 is illustrated with a cross-sectional profile comprising a curved top surface with vertical side surfaces. In other embodiments, the light-altering material 60 may comprise other shapes, including a planar top surface or non-vertical side surfaces. In some embodiments, at least a portion of the light-altering material 60 may extend to an edge 44' of the submount 44. In some embodiments, the encapsulant 50 is arranged on the lumiphoric material 46 and the light-altering material 60.

In some embodiments, the light-altering material 60 is on the lumiphoric material 46 and adjacent to the LED chip 42. For example, the light-altering material 60 is on a portion of the lumiphoric material 46 that is on the surface 48 of the submount 44 adjacent to the LED chip 42. In this regard, light emitting from the LED chip 42 in the certain desired range of emission angles from 0°, such as −65° to 65°, or −60° to 60°, or −50° to 50°, or −45° to 45° may pass through the lumiphoric material 46 and the encapsulant 50 and exit the LED package 40. The light-altering material 60 is positioned to receive light emitting from the LED chip at high emission angles, such as the range of 65° to 90° and −65° to −90°, or −70° to −90° and 70° to 90°, or −80° to −90° and 80° to 90°. In some embodiments, high emission angle light may pass through the lumiphoric material 46 and a portion of the encapsulant 50 and is then redirected or reflected by the light-altering material 60 toward the desired range of emission angles. Depending on the angle, some high emission angle light may redirect or reflect toward the LED chip 42 where it passes through the lumiphoric material 46 a second time. Each time light from the LED chip 42, such as light having a blue peak wavelength, passes through the lumiphoric material 46, more light may be converted to light having a longer peak wavelength, such as yellow, green, red, and combinations thereof. Light with high emission angles, such as angles close or equal to 90°, may sometimes pass through the lumiphoric material 46 multiple times, thereby increasing the amount of longer wavelength light in these areas and decreasing the overall light uniformity of the LED package 40.

In FIG. 4A, a portion of the lumiphoric material 46 is between the light-altering material 60 and the submount 44. Accordingly, at least some light with high emission angles that would otherwise be reflected back toward the LED chip 42 may enter the lumiphoric material 46 and travel between the light-altering material 60 and the submount 44 where it may reflect multiple times before being lost to absorption. In this manner, at least some light with high emission angles is prevented from passing through the lumiphoric material 46 multiple times and the overall light uniformity of the LED package 40 may be improved. Additionally, if the light-altering material 60 is positioned too close to the lumiphoric material 46 on the sidewall 58 of the LED chip 42, more high emission angle light may reflect back and forth between the light-altering material 60 and the lumiphoric material 46, and thereby pass through the lumiphoric material 46 multiple times. Accordingly, in some embodiments, the light-altering material 60 is spaced from the lumiphoric material 46 on the sidewall 58 of the LED chip 42 by a gap 62. In some embodiments, a lateral distance D between the light-altering material 60 and the lumiphoric material 46 on the sidewall 58 is at least 50 microns (µm), or at least 100 µm. In further embodiments, the lateral distance D between the light-altering material 60 and the lumiphoric material 46 on the sidewall 58 comprises a range of about 50 µm to about 300 µm, or about 50 µm to about 200 µm, or about 50 µm to about 150 µm, or about 100 µm to about 300 µm, or about 100 µm to about 200 µm. In some embodiments, the lateral distance D may be less than about 50 µm for at least a portion of the light-altering material 60. The lateral distance D may be the same distance around the perimeter of the LED chip 42 or the lateral distance D may vary around the perimeter of the LED chip 42. In some embodiments, the gap 62 comprises a portion of the encapsulant 50. In that manner, the index of refraction may be different for each of the lumiphoric material 46, the encapsulant 50 in the gap 62, and the light-altering material 60 and, accordingly, light passing through the interfaces between the lumiphoric material 46, the encapsulant 50 in the gap 62, and the light-altering material 60 may experience refraction and increase the likelihood of being redirected toward the desired emission angle of the LED package 40.

As also illustrated in FIG. 4A, the LED chip 42 comprises a first thickness T1 measured in a direction perpendicular to the submount 44. The light-altering material 60 comprises a second thickness T2 also measured in a direction perpendicular to the submount 44. In some embodiments, the second thickness T2 is greater than or equal to the first thickness T1. In that regard, the light-altering material 60 is thicker and/or taller than the thickness or height of the LED chip 42. In particular, the light-altering material 60 is thicker and/or taller than the thickness or height of the sidewall 58 of the LED chip 42. In some embodiments, the first thickness T1 and the second thickness T2 comprise the same or a substantially similar thickness. However, the light-altering material 60 is spaced from the submount 44 by the lumiphoric material 46 and is therefore positioned with a height measured from the submount that is greater than the first thickness T1 of the LED chip 42. Accordingly, light with a larger range of emission angles from the LED chip 42 may interact with the light-altering material 60, and the LED package 40 is configured to provide a narrower spatial intensity distribution.

FIG. 4B illustrates a cross-sectional view of the LED package 40 according to some embodiments where the light-altering material 60 comprises an even greater thickness than the LED chip 42. The LED package 40 includes the LED chip 42, the submount 44, the lumiphoric material 46, the encapsulant 50, and the light-altering material 60 as previously described. The LED chip 42 comprises the first thickness T1 measured in a direction perpendicular to the submount 44. The light-altering material 60 comprises the second thickness T2 also measured in a direction perpendicular to the submount 44. In FIG. 4B, the second thickness T2 is greater than the first thickness T1. In that regard, the light-altering material 60 is thicker and/or taller than the thickness or height of the LED chip 42. In particular, the light-altering material 60 is thicker and/or taller than the thickness or height of the sidewall 58 of the LED chip 42. In some embodiments, the second thickness T2 is at least one and a half times greater than the first thickness T1. In further embodiments, the second thickness T2 is at least two times greater than the first thickness T1. In this manner, a highest elevation position of the light-altering material 60 relative to the submount 44 is greater than a highest elevation position of the lumiphoric material 46 relative to the submount 44. Accordingly, light with an even larger range of emission angles from the LED chip 42 may interact with the light-altering material 60, and the LED package 40 is configured to provide an even narrower spatial intensity distribution. In some embodiments, at least a portion of the light-altering material 60 may extend to the edge 44' of the submount 44.

FIG. 4C illustrates a top view of the LED package 40 of FIG. 4A without the encapsulant 50 according to some embodiments. As illustrated in FIG. 4C, the lumiphoric material 46 is arranged on the LED chip 42 and on at least a portion of the submount 44 that is adjacent to the LED chip 42. In particular, the lumiphoric material 46 may be arranged on the submount 44 within the gap 62 between the light-altering material 60 and the LED chip 42, as well as between the light-altering material 60 and outer edges of the submount 44. As previously described, the light-altering material 60 may comprise many shapes. In FIG. 4C, the light-altering material 60 is illustrated with a circular shape around the perimeter of the LED chip 42 that may comprise the same shape or generally correspond with the shape of a lens base (50" in FIG. 4A), although other shapes are possible, including ovals, squares, squares with rounded edges, and non-symmetric shapes. In some embodiments, the light-altering material 60 comprises a different shape than the perimeter of the LED chip 42. For example, the LED chip 42 may comprise a square shape, and the light-altering material 60 may comprise a circular shape around the perimeter of the LED chip 42 on the submount 44. In other embodiments, the light-altering material 60 comprises a similar shape to the perimeter of the LED chip 42. For example, the LED chip 42 may comprise a square shape, and the light-altering material 60 may also comprise a square shape around the perimeter of the LED chip 42 on the submount 44.

FIG. 4D is a photographic image of the LED package 40 taken from a top view similar to the illustration of FIG. 4C. In FIG. 4D, the light-altering material 60 comprises a generally circular shape, or a square shape with rounded corners. The LED chip 42 is visible underneath the lumiphoric material 46. Additionally, the lumiphoric material 46 is arranged on the submount 44 within the gap 62 between the light-altering material 60 and the LED chip 42, as well as between the light-altering material 60 and outer edges of the submount 44. As previously described, lateral spacing of the gap 62 may vary around the perimeter of the LED chip 42. For example, a first lateral distance D1 of the gap 62 near a corner of the LED chip 42 may be less than a second lateral distance D2 of the gap 62 along a side of the LED chip 42. In some embodiments, the first lateral distance D1 is less than 50 μm while the second lateral distance D2 is greater than 50 μm.

In some embodiments, an LED package includes a light-altering material that comprises a shape that is registered or aligned with a shape of a base of a lens. For example, an encapsulant may comprise a lens with a generally hemispherical shape with a circular lens base that is near a submount of the LED package. In that regard, the light-altering material comprises a circular shape on the submount that is registered with the lens base. Accordingly, the light-altering material and the lens may be configured to further increase the amount of light emitted from the LED package in desired emission angles.

Figure 5:
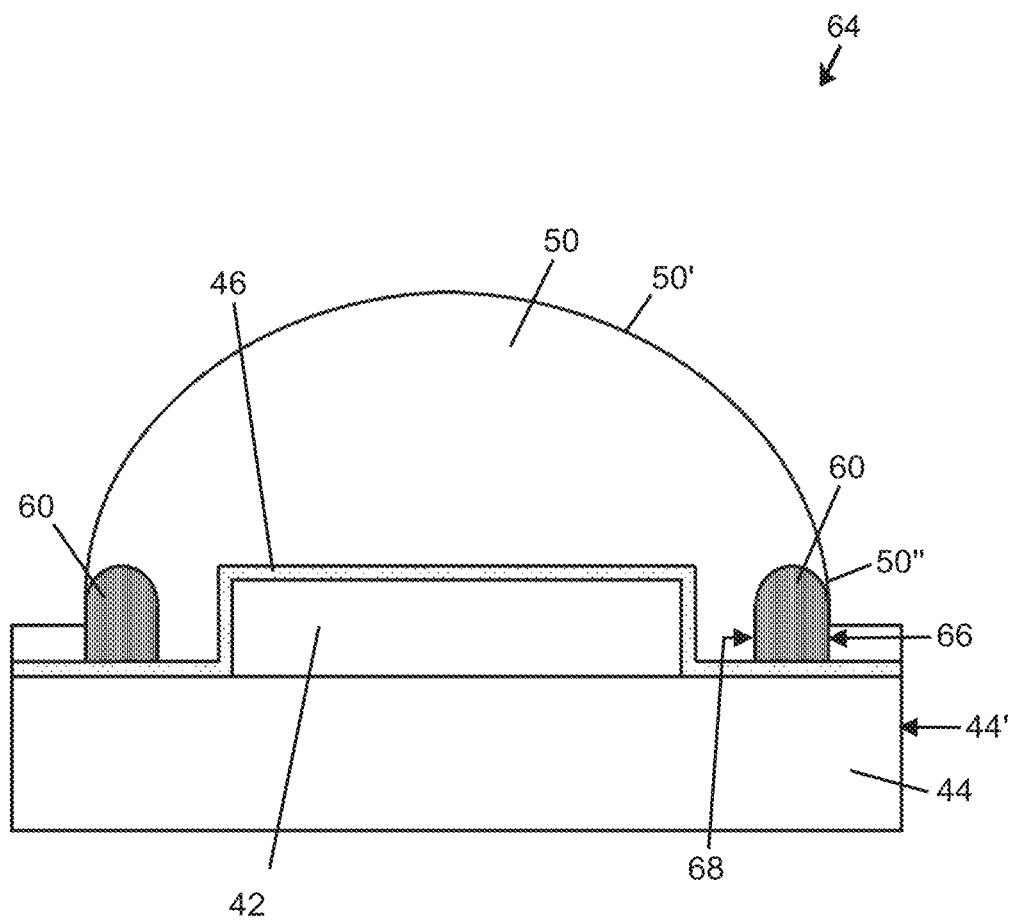
FIG. 5 illustrates a cross-sectional view of an LED package according to some embodiments.

FIG. 5 illustrates a cross-sectional view of an LED package 64 according to some embodiments. The LED package 64 includes the LED chip 42, the submount 44, the lumiphoric material 46, the encapsulant 50, and the light-altering material 60 as previously described. In FIG. 5, the encapsulant 50 comprises the lens 50' that is generally hemispherical or dome-shaped, although other shapes are possible. The shape of the lens 50' further comprises the lens base 50" that is near the submount 44. In some embodiments, the light-altering material 60 comprises an outer face 66 and an inner face 68 that generally opposes the outer face 66. The inner face 68 is arranged closer to the LED chip 42 than the outer face 66. The light-altering material 60 is positioned on the submount 44 such that the outer face 66 of the light-altering material 60 is aligned with the lens base 50". In some embodiments, a gap may exist between the lens base 50" and the outer face 66 (such as the LED package 64 of FIG. 5). In this manner, the light-altering material 60 is registered with the lens base 50". In some embodiments, at least a portion of the light-altering material 60 may extend to the edge 44' of the submount 44.

FIG. 6 illustrates a cross-sectional view of an LED package 70 according to some embodiments. The LED package 70 includes the LED chip 42, the submount 44, the lumiphoric material 46, the encapsulant 50, and the light-altering material 60 comprising the outer face 66 and the inner face 68 that generally opposes the outer face 66 as previously described. In FIG. 6, the encapsulant 50 comprises the lens 50' that is generally hemispherical or dome-shaped, although other shapes are possible, with the lens base 50" that is near the submount 44. The light-altering material 60 is positioned on the submount 44 such that the lens base 50" is aligned between the outer face 66 of the light-altering material 60 and the inner face 68 of the light-altering material 60. Accordingly, the light-altering material 60 is registered with the lens base 50". In some embodiments, at least a portion of the light-altering material 60 may extend to the edge 44' of the submount 44.

FIG. 7 illustrates a cross-sectional view of an LED package 72 according to some embodiments. The LED package 72 includes the LED chip 42, the submount 44, the lumiphoric material 46, the encapsulant 50, and the light-altering material 60 as previously described. In FIG. 7, the encapsulant 50 comprises the lens 50' that is generally hemispherical or dome-shaped, although other shapes are possible. The shape of the lens 50' further comprises the lens base 50" that is near the submount 44. The light-altering material 60 is positioned on the submount 44 such that the inner face 68 of the light-altering material 60 is aligned with the lens base 50". In some embodiments, a gap may exist between the lens base 50" and the inner face 68. In this manner, the light-altering material 60 is registered with the lens base 50". In some embodiments, at least a portion of the light-altering material 60 may extend to the edge 44' of the submount 44.

As previously described, a light-altering material of an LED package may be arranged in different shapes. In that regard, FIG. 8A illustrates a cross-sectional view of an LED package 74 according to some embodiments. The LED package 74 includes the LED chip 42, the submount 44, the lumiphoric material 46, the encapsulant 50, and the light-altering material 60 as previously described. In FIG. 8A, the light-altering material 60 is arranged on the submount 44 from the gap 62 to the edge 44' of the submount 44. In this manner, the lens base 50" is registered between the outer face 66 and the inner face 68 of the light-altering material 60. As previously described, the lens base 50" may be aligned with or separated by a gap with either the outer face 66 or the inner face 68. As illustrated in FIG. 8A, the light-altering material 60 comprises a generally planar upper surface and is arranged such that more of the lumiphoric material 46 is positioned between the light-altering material 60 and the submount 44. Accordingly, high emission angle light from the LED chip 42 that travels between the light-altering material 60 and the submount 44 has an increased likelihood of being absorbed.

FIG. 8B illustrates a top view of the LED package 74 of FIG. 8A without the encapsulant 50 according to some embodiments. As illustrated in FIG. 8B, the lumiphoric material 46 is arranged on the LED chip 42 and on at least a portion of the submount 44 that is adjacent to the LED chip 42. In particular, the lumiphoric material 46 may be arranged on the submount 44 within the gap 62 between the light-altering material 60 and the LED chip 42. Notably the inner face 68 of the light-altering material 60 includes a circular shape that may comprise the same shape or generally correspond with the shape of a lens base (50" in FIG. 8A), although other shapes are possible, including ovals, squares, squares with rounded edges, and non-symmetric shapes.

As previously described, an encapsulant of an LED package may comprise many different shapes depending on the desired shape of the light output. Suitable shapes include hemispheric, ellipsoid, ellipsoid bullet, cubic, flat, hex-shaped and square. In some embodiments, a suitable shape includes both curved and planar surfaces, such a hemispheric or curved top portion with planar side surfaces.

FIG. 9A illustrates a cross-sectional view of an LED package 76 that includes the encapsulant 50 with a hemispheric or curved top portion 78 and one or more planar side surfaces 80 according to some embodiments. The LED package 76 includes the LED chip 42, the submount 44, the lumiphoric material 46, the encapsulant 50, and the light-altering material 60 as previously described. The encapsulant 50 comprises the lens 50' that includes the hemispheric or curved top portion 78 and the one or more planar side surfaces 80 that are near lateral edges of the submount 44. The one or more planar side surfaces 80 may be configured in some embodiments to provide a different emission profile of the LED package 76 than other embodiments. In some embodiments, the one or more planar side surfaces 80 may be configured such that the hemispheric or curved top portion 78 comprises a greater radius of curvature than the dimensions of the submount 44 would otherwise allow. In some embodiments, at least a portion of the light-altering material 60 may extend to the edge 44' of the submount 44. FIG. 9B illustrates a top view of the LED package 76 of FIG. 9A. In FIG. 9B, four planar side surfaces 80 of the lens 50' are visible and are connected by curved side surfaces 82. Additionally, the lumiphoric material 46 is arranged on the LED chip 42 and on at least a portion of the submount 44 that is adjacent to the LED chip 42. The light-altering material 60 may follow the shape of the planar side surfaces 80 with the connecting curved side surfaces 82 of the lens 50'. Accordingly, the light-altering material 60 may include a generally square shape with rounded corners around the perimeter of the LED chip 42. In other embodiments, the light-altering material 60 may include other shapes around the perimeter of the LED chip 42 including circular, oval, square, and non-symmetric shapes. Additionally, the light-altering material 60 may be registered with the lens base as previously described.

FIG. 10 illustrates a cross-sectional view of an LED package 84 that includes the encapsulant 50 with a planar top surface 86 and one or more planar side surfaces 88 according to some embodiments. The LED package 84 includes the LED chip 42, the submount 44, the lumiphoric material 46, the encapsulant 50, and the light-altering material 60 as previously described. In some embodiments, at least a portion of the light-altering material 60 may extend to the edge 44' of the submount 44. The encapsulant 50 comprises the lens 50' that includes the planar top surface 86 and the one or more planar side surfaces 88 that are near the lateral edges of the submount 44. The planar top surface 86 and the one or more planar side surfaces 88 may be configured in some embodiments to provide a different emission profile of the LED package 84 than other embodiments. Additionally, the planar top surface 86 and the one or more planar side surfaces 88 may be configured to promote additional reflections of light within the encapsulant 50 that may increase the likelihood that some light would pass through the lumiphoric material 46 multiple times before exiting the encapsulant 50.

FIG. 11A illustrates a cross-sectional view of an LED package 90 that includes the encapsulant 50 with the planar top surface 92 and planar side surfaces 94 according to some embodiments. The LED package 90 includes the LED chip 42, the submount 44, the lumiphoric material 46, the encapsulant 50, and the light-altering material 60 as previously described. In FIG. 11A, the planar top surface 92 is spaced closer to the LED chip 42 than the embodiment of FIG. 10. In some embodiments, the planar top surface 92 is spaced a distance from the LED chip 42 no greater than a thickness of the LED chip 42 measured in a direction perpendicular to the submount 44. In further embodiments, the planar top surface 92 is spaced a distance from the LED chip 42 no greater than one half the thickness of the LED chip 42 measured in a direction perpendicular to the submount 44. Accordingly, the light-altering material 60 prevents more light from reaching the planar side surfaces 94 and the LED package 90 may comprise a narrower spatial intensity distribution. FIG. 11B illustrates a cross-sectional view of an LED package 96 that includes the encapsulant 50 with a planar top surface 98 and planar side surfaces 100 according to some embodiments. The LED package 96 includes the LED chip 42, the submount 44, the lumiphoric material 46, the encapsulant 50, and the light-altering material 60 as previously described. However, in FIG. 11B, the light-altering material 60 is arranged on the submount 44 from the gap 62 (between the light-altering material 60 and the LED chip 42) to the edge 44' of the submount 44. As illustrated in FIG. 11B, the light-altering material 60 is arranged such that more of the lumiphoric material 46 is positioned between the light-altering material 60 and the submount 44. Accordingly, high emission angle light from the LED chip 42 that travels between the light-altering material 60 and the submount 44 has an increased likelihood of being absorbed.

Any of the previously-described embodiments would be applicable to LED packages that comprise more than one LED chip, such as multiple-chip LED packages comprising two LED chips, four LED chips, or even larger arrays of LED chips. Accordingly, the LED chip of previous embodiments may be substituted with a plurality of LED chips. In that regard, FIG. 12 illustrates a cross-sectional view of an LED package 102 that includes a plurality of LED chips 42A, 42B according to some embodiments. The LED package 102 includes the submount 44, the lumiphoric material 46, the encapsulant 50, and the light-altering material 60 as described for any of the previous embodiments. In some embodiments, at least a portion of the light-altering material 60 may extend to the edge 44' of the submount 44. In FIG. 12, the LED chips 42A, 42B are arranged on the submount 44 with a gap 104 between them. In some embodiments, the lumiphoric material 46 is continuous across the gap 104 between the LED chips 42A, 42B. Accordingly, the lumiphoric material 46 may increase the homogeneity of emissions between the LED chips 42A, 42B such that the LED package 102 is configured with an appearance of single large LED, rather than the plurality of individual LED chips 42A, 42B. In some embodiments, the gap 104 may comprise air or an air gap, while in other embodiments, the gap 104 may comprise a filler material. The filler material may comprise silicones, epoxies or other similar materials. In some embodiments, the filler material comprises a reflective material by including reflective particles (e.g. $TiO_2$ or other reflective particles) mixed in a silicone or epoxy. In other embodiments, the filler material can comprise separately molded pieces that may be inserted in the space between the LED chips 42A, 42B before deposition of the lumiphoric material 46. In other embodiments, the gap 104 comprises the same material as the lumiphoric material 46 such that the lumiphoric material 46 is continuous into the gap 104. Accordingly, the lumiphoric material 46 may further increase the homogeneity of emissions between the LED chips 42A, 42B.

Figure 13:
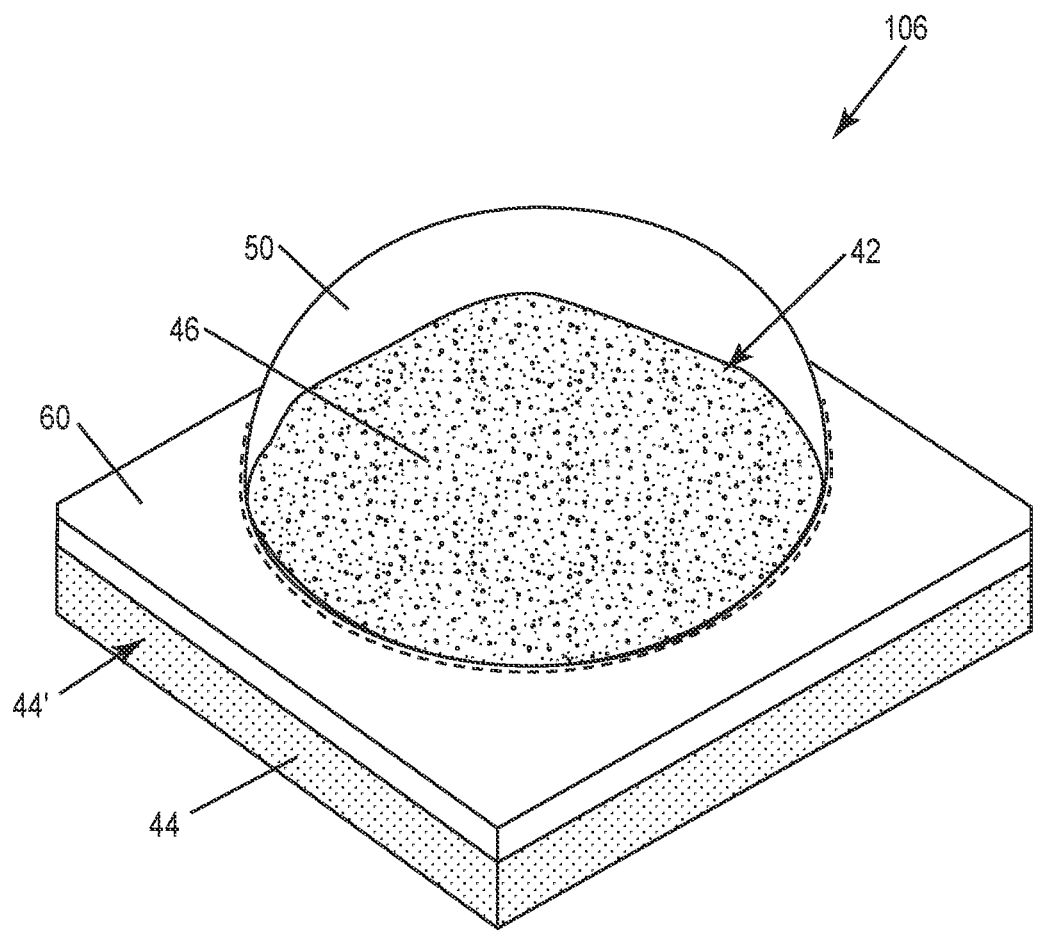
FIG. 13 is a perspective view photograph of an LED package according to some embodiments of the present disclosure.

FIG. 13 is a perspective view photograph of an LED package 106 according to some embodiments of the present disclosure. The LED package 106 includes the LED chip 42, the submount 44, the lumiphoric material 46, the encapsulant 50, and the light-altering material 60 as previously described. In FIG. 13, the light-altering material 60 is arranged on the submount 44 around the perimeter of the LED chip 42 and further extends to the edge 44' of the submount 44. In this manner, the lumiphoric material 46 is visible only on the LED chip 42 and any portion of the submount 44 that is not covered by the light-altering material 60. The presence of the encapsulant 50 can magnify or distort portions of the image underneath the encapsulant 50. A curved dashed line is superimposed to increase visibility of a boundary of the light-altering material 60 around the perimeter of the LED chip 42.

Figure 14:
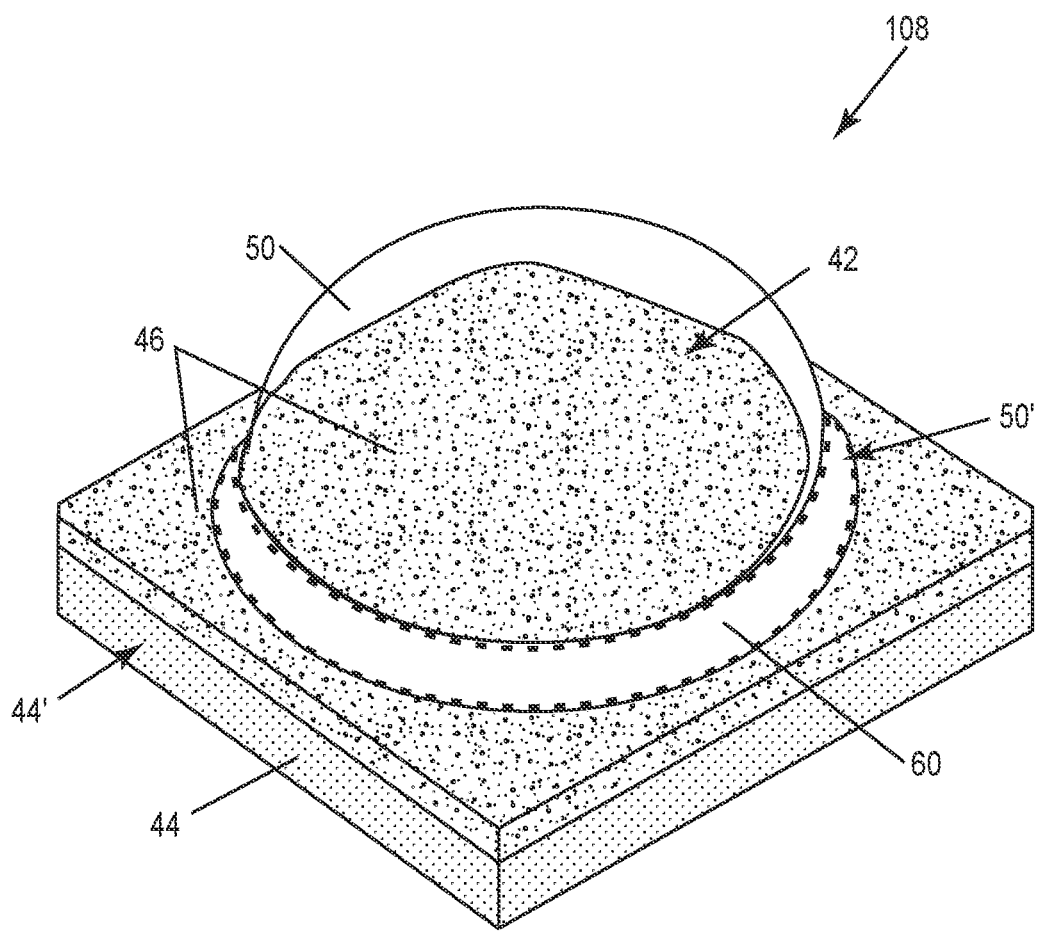
FIG. 14 is a perspective view photograph of an LED package according to some embodiments of the present disclosure.

FIG. 14 is a perspective view photograph of an LED package 108 according to some embodiments of the present disclosure. The LED package 108 includes the LED chip 42, the submount 44, the lumiphoric material 46, the encapsulant 50, and the light-altering material 60 as previously described. In FIG. 14, the light-altering material 60 is arranged on the submount 44 around the perimeter of the LED chip 42 and registered with the base 50" of the lens 50' of the encapsulant 50. In this manner, the lumiphoric material 46 is visible on the LED chip 42 as well as on the submount 44 between the light-altering material 60 and the edge 44' of the submount 44. The presence of the encapsulant 50 can magnify or distort portions of the image underneath the encapsulant 50. A pair of curved dashed lines are superimposed to increase visibility of boundaries of the light-altering material 60 around the perimeter of the LED chip 42.

FIG. 15 illustrates a cross-sectional view of an LED package 110 according to some embodiments. The LED package 110 includes the LED chip 42, the submount 44, the lumiphoric material 46, the encapsulant 50, and the light-altering material 60 as previously described. However, in FIG. 15, the light-altering material 60 has been formed after the encapsulant 50 has been formed. Accordingly, the light-altering material 60 is on the encapsulant 50, and a portion of the encapsulant 50 is between the light-altering material 60 and the submount 44. Additionally, the portion of the encapsulant 50 may also be arranged between the light-altering material 60 and the lumiphoric material 46. In this manner, a light-altering material may be added to LED packages that have already been encapsulated. In some embodiments, at least a portion of the light-altering material 60 may extend to the edge 44' of the submount 44.

In some embodiments, an LED package may include additional layers between a light-altering material and a submount. In that regard, FIG. 16A illustrates a cross-sectional view of an LED package 112 according to some embodiments. The LED package 112 includes the LED chip 42, the submount 44, the lumiphoric material 46, the encapsulant 50, and the light-altering material 60 as previously described. FIG. 16A also includes a reflective layer 114 between the light-altering material 60 and the submount 44. The reflective layer 114 may also be arranged between the lumiphoric material 46 and the submount 44. In some embodiments, the reflective layer 114 is also arranged between the LED chip 42 and the submount 44. FIG. 16B illustrates a cross-sectional view of an LED package 116 according to other embodiments. In FIG. 16B, the reflective layer 114 is not between the LED chip 42 and the submount 44. In this manner, the reflective layer 114 is formed after the LED chip 42 has been mounted to the submount 44, and the reflective layer 114 is arranged between the light-altering material 60 and the submount 44 around the perimeter of the LED chip 42. The reflective layer 114 may also be arranged between the lumiphoric material 46 and the submount 44 around the perimeter of the LED chip 42. In some embodiments of FIG. 16A and FIG. 16B, at least a portion of the light-altering material 60 may extend to the edge 44' of the submount 44.

The reflective layer 114 may comprise any suitable material that is reflective to light emitted from the LED chip 42 and/or the lumiphoric material 46. In some embodiments, the reflective layer 114 comprises the same material as the light-altering material 60. For example, the light-altering material 60 and the reflective layer 114 may both comprise reflective particles suspended in a binder, such as $TiO_2$ particles in silicone. In other embodiments, the reflective layer 114 comprises a different material than the light-altering material 60. For example, the light-altering material 60 may comprise reflective particles suspended in a binder while the reflective layer 114 comprises a metal layer. In embodiments where the reflective layer 114 comprises a metal layer, the reflective layer 114 may comprise electrical traces for making electrical connections with the LED chip 42.

FIG. 17 illustrates a cross-sectional view of an LED package 118 according to some embodiments. The LED package 118 includes the LED chip 42, the submount 44, the lumiphoric material 46, the encapsulant 50, and the light-altering material 60 as previously described. In FIG. 17, the light-altering material 60 was formed before the lumiphoric material 46 was applied. In that regard, the light-altering material 60 is arranged around the perimeter of the LED chip 42 on the submount 44, and the lumiphoric material 46 is arranged on the LED chip 42, the submount 44, and the light-altering material 60. In some embodiments, at least a portion of the light-altering material 60 may extend to the edge 44' of the submount 44.

FIG. 18 illustrates a cross-sectional view of an LED package 120 according to some embodiments. The LED package 120 includes the LED chip 42, the submount 44, the lumiphoric material 46, the encapsulant 50, and the light-altering material 60 as previously described. In some embodiments, at least a portion of the light-altering material 60 may extend to the edge 44' of the submount 44. In some embodiments, an additional layer 122 may be provided between the light-altering material 60 and the lumiphoric material 46. For example, the additional layer 122 may comprise a spacer layer or a smoothing layer that provides a more even surface on which the light-altering material 60 may be formed. The additional layer 122 may comprise silicone, one or more dielectric layers, one or adhesion layers, one or more reflective layers, or one or more layers of different lumiphoric materials.

FIG. 19 illustrates a cross-sectional view of an LED package 124 according to some embodiments. The LED package 124 includes the LED chip 42, the submount 44, the lumiphoric material 46, the encapsulant 50, and the light-altering material 60 as previously described. In some embodiments, at least a portion of the light-altering material 60 may extend to the edge 44' of the submount 44. In FIG. 19, the light-altering material 60 is additionally arranged to cover an electrical element 126 of the LED package 124. The electrical element 126 may comprise an electrostatic discharge (ESD) chip, an electrical trace, or one or more elements of a control circuit for the LED chip 42. The electrical element 126 may absorb light emitted from the LED chip 42 or the lumiphoric material 46. Accordingly, by arranging the light-altering material 60 over the electrical element 126, the appearance of a dark spot will be reduced. In some embodiments, the lumiphoric material 46 is arranged between the light-altering material 60 and the electrical element 126. As also illustrated in FIG. 19, the light-altering material 60 may comprise different shapes around the perimeter of the LED chip 42. For example, the light-altering material 60 may be taller or wider on one portion of the submount 44 than the other. Accordingly, the spatial intensity distribution of light from the LED package 124 may tailored for different applications.

FIG. 20 illustrates a top view of an LED package 128 according to some embodiments. The LED package 128 includes the LED chip 42, the submount 44, and the lumiphoric material 46 as previously described. In FIG. 20, a plurality of light-altering material segments 60-1, 60-2 are arranged around the perimeter of the LED chip 42. The segments 60-1, 60-2 are illustrated as discontinuous with each other. In this manner, high emission angle light may be redirected or reflected by the segments 60-1, 60-2 while high emission angle light escapes from the LED package 128 in areas where the segments 60-1, 60-2 are discontinuous with each other. Accordingly, the spatial intensity distribution of light from the LED package 128 may comprise a non-uniform pattern. In this example, the spatial intensity distribution may comprise an oval pattern that may be useful in certain applications, such as streetlights. In other embodiments, different light distribution patterns are provided by changing the number of light-altering material segments as well as the location of where the light-altering material segments are discontinuous with each other. In some embodiments, one or more of the segments 60-1, 60-2 may comprise a different shape, dimension, reflectivity or other optical property that can tailor the spatial intensity distribution of light from the LED package 128 for different applications. In embodiments where the segments 60-1, 60-2 comprise a different shape, dimension, reflectivity or other optical property, the segments 60-1, 60-2 may be discontinuous or continuous with each other.

FIG. 21 illustrates a cross-sectional view of an LED package 130 according to some embodiments. The LED package 130 includes the LED chip 42, the submount 44, the lumiphoric material 46, the encapsulant 50, and the light-altering material 60 as previously described. The LED package 130 additionally includes an additional material 132 arranged between the light-altering material 60 and the edge 44' of the submount 44. The additional material 132 may comprise a layer or a coating on portions of the lumiphoric material 46 and the submount 44 between the light-altering material 60 to the edge 44'. In some embodiments, the additional material 132 also comprises light-altering materials that may redirect, reflect, or absorb light from the LED chip 42 and the lumiphoric material 46. The additional material 132 may comprise the same materials as the light-altering material 60 or different materials. In one embodiment, the additional material 132 and the light-altering material 60 both comprise a white color. In other embodiments, the additional material 132 may comprise an opaque or black color, and the light-altering material 60 comprises a white color. In other embodiments, the additional material 132 may comprise a light-transmissive material. In FIG. 21, the light-altering material 60 may be formed on the lumiphoric material 46 as previously described. The additional material 132 may then be formed on the lumiphoric material 46 and the submount 44 to cover the area between the light-altering material 60 and the edge 44' of the submount 44. The encapsulant 50 may be formed by a dispensing process that utilizes the light-altering material 60 as a dam around the perimeter of the LED chip 42, and the encapsulant 50 may be filled inside the dam to cover the LED chip 42. The encapsulant 50 may be dispensed before or after the additional material 132 has been formed. In some embodiments, the encapsulant 50 comprises one or more lumiphors that are either similar or different than the lumiphoric material 46.

FIG. 22 illustrates a cross-sectional view of an LED package 134 according to some embodiments. The LED package 134 includes the LED chip 42, the submount 44, the lumiphoric material 46, the encapsulant 50, the light-altering material 60, and the additional material 132 as previously described. FIG. 22 is similar to the LED package 130 of FIG. 21, except at least a portion of the encapsulant 50 extends to the edge 44' of the submount 44. In some embodiments, the encapsulant 50 covers the light-altering material 60 and the additional material 132. In that regard, the encapsulant 50 may be formed by a molding process after the light-altering material 60 and the additional material 132 have been formed.

FIG. 23 illustrates a cross-sectional view of an LED package 136 according to some embodiments. The LED package 136 includes the LED chip 42, the submount 44, the lumiphoric material 46, the encapsulant 50, the light-altering material 60, and the additional material 132 as previously described. FIG. 23 is similar to the LED package 134 of FIG. 22, except the light-altering material 60 and the additional material 132 are thicker and/or taller than the thickness or height of the LED chip 42 and the portion of the lumiphoric material 52 on the LED chip 42. In some embodiments, the light-altering material 60 and the additional material 132 comprise a thickness and/or a height that is at least one and a half times greater than a thickness and/or a height of the LED chip 42. In other embodiments, the light-altering material 60 and the additional material 132 comprise a thickness and/or a height that is at least two times greater than a thickness and/or a height of the LED chip 42. Accordingly, the LED package 136 may comprise a narrower spatial intensity distribution for certain embodiments.

FIG. 24 illustrates a cross-sectional view of an LED package 138 according to some embodiments. The LED package 138 includes the LED chip 42, the submount 44, the lumiphoric material 46, the encapsulant 50, the light-altering material 60, and the additional material 132 as previously described. FIG. 24 is similar to the LED package 130 of FIG. 21, except the lumiphoric material 46 covers the LED chip 42 and a portion of the submount 44 that is between the light-altering material 60 and the LED chip 42, and the lumiphoric material 46 does not extend between the submount 44 and the light-altering material 60 or the additional material 132. In that regard, the light-altering material 60 may be applied to the LED package 138 after the light-altering material 60 has been formed. The additional material 132 may be formed before or after the lumiphoric material 46 has been applied to the LED package 138. As previously described, the encapsulant 50 may be dispensed before or after the additional material 132 has been formed. In some embodiments, the encapsulant 50 comprises one or more lumiphors that are either similar or different than the lumiphoric material 46.

FIG. 25 illustrates a cross-sectional view of an LED package 140 according to some embodiments. The LED package 140 includes the LED chip 42, the submount 44, the lumiphoric material 46, the encapsulant 50, the light-altering material 60, and the additional material 132 as previously described. FIG. 24 is similar to the LED package 134 of FIG. 22, except the lumiphoric material 46 covers the LED chip 42 and a portion of the submount 44 that is between the light-altering material 60 and the LED chip 42, and the lumiphoric material 46 does not extend between the submount 44 and the light-altering material 60 or the additional material 132. In that regard, the light-altering material 60 may be applied to the LED package 140 after the light-altering material 60 has been formed. The additional material 132 may be formed before or after the lumiphoric material 46 has been applied to the LED package 140. As previously described, the encapsulant 50 may be formed by a molding process after the light-altering material 60 and the additional material 132 have been formed.

Figure 26:
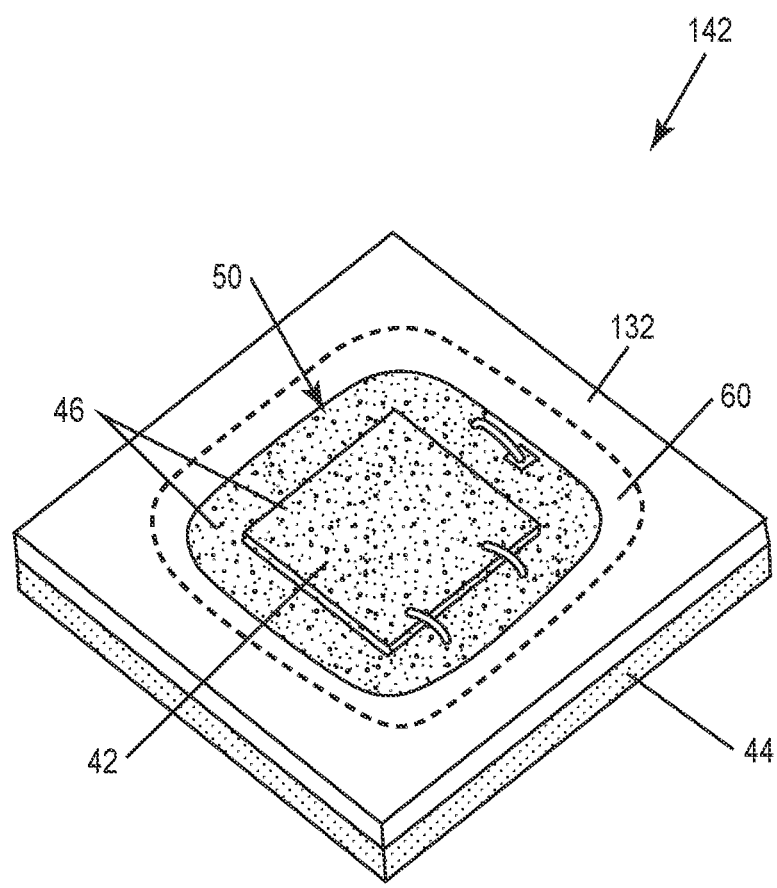
FIG. 26 is a perspective view photograph of an LED package according to some embodiments of the present disclosure.

FIG. 26 is a perspective view photograph of an LED package 142 according to some embodiments of the present disclosure. The LED package 142 includes the LED chip 42, the submount 44, the lumiphoric material 46, the encapsulant 50, the light-altering material 60, and the additional material 132 as previously described. In FIG. 26, the light-altering material 60 is arranged on the submount 44 around the perimeter of the LED chip 42. The additional material 132 is arranged to cover the submount 44 between the light-altering material 60 and the edge 44' of the submount 44 (as also illustrated in FIG. 21 and FIG. 22). In this manner, the lumiphoric material 46 is visible only on the LED chip 42 and any portion of the submount 44 that is not covered by the light-altering material 60 and the additional material 132. In FIG. 26, the light-altering material 60 and the additional material 132 both comprise a white material. Accordingly, a curved dashed line is superimposed to increase visibility of a boundary between the light-altering material 60 and the additional material 132 around the perimeter of the LED chip 42.

Those skilled in the art will recognize improvements and modifications to the preferred embodiments of the present disclosure. All such improvements and modifications are considered within the scope of the concepts disclosed herein and the claims that follow.

What is claimed is:
1. A light emitting diode (LED) package comprising:
a submount;
at least one LED chip on the submount;
a lumiphoric material arranged on the at least one LED chip and on at least a portion of the submount adjacent to the at least one LED chip;
a light-altering material on the lumiphoric material and arranged around a perimeter of the at least one LED chip such that the light-altering material is arranged in a position that is spaced from an edge of the submount; and
an encapsulant over the at least one LED chip, wherein the encapsulant is arranged to extend past the light-altering material and to the edge of the submount;
wherein the encapsulant forms a shape that includes a lens and a lens base; and
wherein the light-altering material is registered with the lens base.
2. The LED package of claim 1, wherein the light-altering material comprises:
an outer face and an inner face that generally opposes the outer face, wherein the outer face is aligned with the lens base.
3. The LED package of claim 1, wherein the light-altering material comprises:
an outer face and an inner face that generally opposes the outer face, wherein the lens base is aligned between the outer face and the inner face.
4. The LED package of claim 1, wherein the light-altering material comprises:
an outer face and an inner face that generally opposes the outer face, wherein the inner face is aligned with the lens base.
5. The LED package of claim 1, wherein the lens comprises a hemispherical shape with a circular lens base.
6. The LED package of claim 1, wherein the lens comprises a curved top surface and one or more planar side surfaces.
7. The LED package of claim 1, wherein the lens comprises a planar top surface and one or more planar side surfaces.
8. The LED package of claim 1, wherein the at least one LED chip comprises a plurality of LED chips.
9. The LED package of claim 1, wherein the light-altering material comprises a light-reflective material.
10. The LED package of claim 9, wherein the light-reflective material comprises at least one of fused silica, fumed silica, or titanium dioxide ($TiO_2$) particles suspended in silicone.
11. The LED package of claim 1, wherein the light-altering material comprises a light-absorbing material.
12. A light emitting diode (LED) package comprising:
a submount;
at least one LED chip on the submount;
a lumiphoric material arranged on the at least one LED chip and on at least a portion of the submount adjacent to the at least one LED chip;
an encapsulant layer on the lumiphoric material, wherein the encapsulant layer forms a shape that includes a lens; and
a light-altering material arranged around a perimeter of the at least one LED chip and outside a perimeter of the lens;
wherein a portion of the encapsulant layer is arranged between the light-altering material and the submount such that at least a top portion of the light-altering material is uncovered by the encapsulant.
13. The LED package of claim 12, wherein a portion of the lumiphoric material is arranged between the light-altering material and the submount.

14. The LED package of claim 13, wherein the portion of the encapsulant layer that is arranged between the light-altering material and the submount is also arranged between the light-altering material and the portion of the lumiphoric material that is arranged between the light-altering material and the submount.

15. The LED package of claim 12, wherein the encapsulant layer comprises silicone.

16. The LED package of claim 12, wherein the encapsulant layer entirely covers the lumiphoric material and the at least one LED chip.

17. The LED package of claim 12, wherein the encapsulant layer forms a lens base and the light-altering material is registered with the lens base.

18. The LED package of claim 17, wherein the lens comprises a curved top surface.

19. The LED package of claim 18, wherein the lens further comprises one or more planar side surfaces.

20. The LED package of claim 17, wherein the lens comprises a planar top surface and one or more planar side surfaces.

21. A light emitting diode (LED) package comprising:
a submount;
at least one LED chip on the submount;
a light-altering material arranged around a perimeter of the at least one LED chip; and
a lumiphoric material that forms a coating over the at least one LED chip, the light-altering material, and a portion of the submount that is uncovered by the at least one LED chip and the light-altering material, wherein the light-altering material is arranged between the lumiphoric material and the submount.

22. The LED package of claim 21, further comprising an encapsulant layer on the lumiphoric material, the at least one LED chip, and the light-altering material.

23. The LED package of claim 22, wherein the encapsulant layer forms a shape that includes a lens with a lens base and the light-altering material is registered with the lens base.

24. The LED package of claim 23, wherein the lens comprises a curved top surface.

25. The LED package of claim 24, wherein the lens further comprises one or more planar side surfaces.

26. The LED package of claim 23, wherein the lens comprises a planar top surface and one or more planar side surfaces.

* * * * *